(12) United States Patent
Inagaki et al.

(10) Patent No.: US 10,879,837 B2
(45) Date of Patent: Dec. 29, 2020

(54) PHOTOVOLTAIC MODULE AND PHOTOVOLTAIC PANEL

(71) Applicant: Sumitomo Electric Industries, Ltd., Osaka (JP)

(72) Inventors: Makoto Inagaki, Osaka (JP); Youichi Nagai, Osaka (JP); Kenji Saito, Osaka (JP); Takashi Iwasaki, Osaka (JP); Rui Mikami, Osaka (JP); Tomohiro Nemoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 89 days.

(21) Appl. No.: 15/321,098

(22) PCT Filed: Jun. 22, 2015

(86) PCT No.: PCT/JP2015/067821
§ 371 (c)(1),
(2) Date: Dec. 21, 2016

(87) PCT Pub. No.: WO2015/199004
PCT Pub. Date: Dec. 30, 2015

(65) Prior Publication Data
US 2017/0133980 A1    May 11, 2017

(30) Foreign Application Priority Data

Jun. 27, 2014 (JP) .................... 2014-132501
Sep. 8, 2014 (JP) .................... 2014-182362

(51) Int. Cl.
*H02S 40/22* (2014.01)
*H02S 20/32* (2014.01)
(Continued)

(52) U.S. Cl.
CPC ............ *H02S 40/22* (2014.12); *H01L 31/048* (2013.01); *H01L 31/0543* (2014.12);
(Continued)

(58) Field of Classification Search
CPC .......... H02S 40/22; H02S 20/10; H02S 20/32; H02S 30/10; H01L 31/048; H01L 31/0543; F24S 25/20; F24S 2025/015
(Continued)

(56) References Cited

U.S. PATENT DOCUMENTS 5,497,587 A    3/1996  Hirai et al.
6,057,505 A *  5/2000  Ortabasi ............. H01L 31/0687
                                                              136/246
(Continued)

FOREIGN PATENT DOCUMENTS

CN    1558410 A     12/2004
JP    06-158798 A    6/1994
(Continued)

OTHER PUBLICATIONS

International Search Report in counterpart International Application No. PCT/JP20151067821, dated Aug. 18, 2015.
(Continued)

*Primary Examiner* — Magali P Slawski
*Assistant Examiner* — Kourtney R S Carlson
(74) *Attorney, Agent, or Firm* — Baker Botts L.L.P.; Michael A. Sartori

(57) ABSTRACT

This photovoltaic module includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrat-
(Continued)

ing portion. The side wall is formed from a resin and has at least one vent hole.

12 Claims, 23 Drawing Sheets

(51) Int. Cl.
    *H02S 20/10*     (2014.01)
    *H01L 31/054*     (2014.01)
    *H02S 30/10*     (2014.01)
    *H01L 31/048*     (2014.01)

(52) U.S. Cl.
    CPC .............. *H02S 20/10* (2014.12); *H02S 20/32* (2014.12); *H02S 30/10* (2014.12); *Y02E 10/52* (2013.01)

(58) Field of Classification Search
    USPC .................................................. 136/242–265
    See application file for complete search history.

(56) References Cited

U.S. PATENT DOCUMENTS

| | | | |
|---|---|---|---|
| 6,399,874 B1 | 6/2002 | Olah | |
| 6,559,371 B2* | 5/2003 | Shingleton | H01L 31/0543 136/246 |
| 8,592,738 B1 | 11/2013 | Kozin et al. | |
| 2002/0148497 A1* | 10/2002 | Sasaoka | G02B 6/4298 136/243 |
| 2006/0266408 A1 | 11/2006 | Horne et al. | |
| 2007/0295384 A1* | 12/2007 | Uozumi | F24S 23/31 136/246 |
| 2009/0126794 A1* | 5/2009 | Dimroth | H01L 31/052 136/259 |
| 2009/0133737 A1 | 5/2009 | Anzawa et al. | |
| 2009/0260674 A1* | 10/2009 | Linke | H01L 31/048 136/246 |
| 2010/0018570 A1* | 1/2010 | Cashion | H01L 31/052 136/246 |
| 2011/0030767 A1 | 2/2011 | Ehbing et al. | |
| 2012/0325289 A1* | 12/2012 | Deck | H01L 31/052 136/246 |
| 2015/0059851 A1 | 3/2015 | Gerster et al. | |
| 2015/0136201 A1* | 5/2015 | Mariotto | H01L 31/024 136/246 |
| 2017/0149377 A1 | 5/2017 | Inagaki et al. | |

FOREIGN PATENT DOCUMENTS

| | | | |
|---|---|---|---|
| JP | 07-274742 A | 10/1995 | |
| JP | 10-152957 A | 6/1998 | |
| JP | H10-231600 A | 9/1998 | |
| JP | 2002-289900 A | 10/2002 | |
| JP | 2006-344698 A | 12/2006 | |
| JP | 2008-004661 A | 1/2008 | |
| JP | 2008-84955 A | 4/2008 | |
| JP | 4953745 B2 | 6/2012 | |
| JP | 2013-207079 A | 10/2013 | |
| JP | 2014-99492 A | 5/2014 | |
| WO | 2013/150031 A1 | 10/2013 | |
| WO | WO-2014009288 A1 * | 1/2014 | ........... H01L 31/024 |

OTHER PUBLICATIONS

Office Action dated Mar. 28, 2019 issued for co-pending U.S. Appl. No. 15/320,709.
Office Action dated Jan. 9, 2019 issued for co-pending U.S. Appl. No. 15/320,709.
Final Office Action issued in U.S. Appl. No. 15/320,709, dated Oct. 21, 2019.
Office Action issued in U.S. Appl. No. 15/320,709, dated Apr. 3, 2020.

* cited by examiner

PHOTOVOLTAIC MODULE AND PHOTOVOLTAIC PANEL

TECHNICAL FIELD

The present invention relates to a photovoltaic module, and in particular, relates to a photovoltaic module in which power generating elements provided in the housing thereof receive sunlight to generate power corresponding to an amount of the received light.

BACKGROUND ART

To date, photovoltaic modules which concentrate sunlight and convert the sunlight into power have been developed. For example, PATENT LITERATURE 1 (International Publication WO 2013/150031) discloses the following technology. That is, the concentrator photovoltaic apparatus described in PATENT LITERATURE 1 includes a lens and a power generating element in a housing, wherein a gas is caused to flow into the housing whereby the distance between the lens and the power generating element is adjusted.

Meanwhile, for example, PATENT LITERATURE 2 (U.S. Pat. No. 8,592,738) discloses the following technology.

That is, in the concentrator solar generator described in PATENT LITERATURE 2, a device for confirming the optical axis of incident light is mounted.

Next, for example, PATENT LITERATURE 3 (Japanese Patent No. 4953745) discloses the following technology. That is, the concentrator photovoltaic unit described in PATENT LITERATURE 3 includes: a translucent protecting plate on which condenser lenses for concentrating sunlight are joined and which protects the upper face of the concentrator photovoltaic unit; a long-sized frame forming the basic structure of the concentrator photovoltaic unit; and a solar battery mounting plate on which a plurality of solar batteries are mounted. The long-sized frame is provided with vent holes at end portions in the longitudinal direction, thereby generating an airflow inside the long-sized frame.

Furthermore, for example, PATENT LITERATURE 4 (Japanese Laid-Open Patent Publication No. 2008-4661) discloses the following technology. That is, the concentrator solar generator described in PATENT LITERATURE 4 includes a case surrounded by a bottom member, a surrounding member, and a top member, the case having a space formed therein, the case configured to be inclined when used such that the top member faces the sun. The top member of this case is provided with a plurality of Fresnel lenses for concentrating sunlight. Inside the case, a plurality of solar battery cells are provided which respectively receive light concentrated by the respective Fresnel lenses to generate power. At least two opening portions are provided in each of opposed surfaces of the surrounding member of the case. In addition, one of the two opening portions in each of the opposed surfaces is disposed at an upper portion close to the Fresnel lenses and the other is disposed at a lower portion close to the solar battery cells.

CITATION LIST

Patent Literature

PATENT LITERATURE 1: International Publication WO2013/150031
PATENT LITERATURE 2: U.S. Pat. No. 8,592,738
PATENT LITERATURE 3: Japanese Patent No. 4953745
PATENT LITERATURE 4: Japanese Laid-Open Patent Publication No. 2008-4661
PATENT LITERATURE 5: Japanese Laid-Open Patent Publication No. H7-274742

SUMMARY OF INVENTION

Technical Problem

The underlying common and ultimate challenge for the conventional technologies mentioned above is to apply concentrated sunlight to each power generating element always at an accurate position on the optical axis in severe outdoor environment. However, it is difficult to always realize such accurate application of light in severe environment, and as a result, sufficient power generation efficiency has not been attained.

In view of the above problem, an object of the present invention is to realize a configuration that can further enhance the power generation efficiency of a photovoltaic module.

Solution to Problem

A photovoltaic module of the present invention includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion, wherein the side wall is formed from a resin and has at least one vent hole.

A photovoltaic module of the present invention includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion, wherein the side wall is formed from a resin and has at least one vent hole, and the housing includes a fitting portion capable of being fitted to the housing of another photovoltaic module.

Meanwhile, a photovoltaic panel of the present invention includes: a panel housing in a dish-like shape partitioned into a plurality of sections by a frame member; and a plurality of photovoltaic modules respectively mounted in the sections, wherein each photovoltaic module includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion, and the side wall is formed from a resin and has at least one vent hole.

Advantageous Effects of Invention

According to the present invention, it is possible to realize a configuration that can further enhance the power generation efficiency of a photovoltaic module.

DESCRIPTION OF EMBODIMENTS

[Summary of Embodiment]

Figure 1:
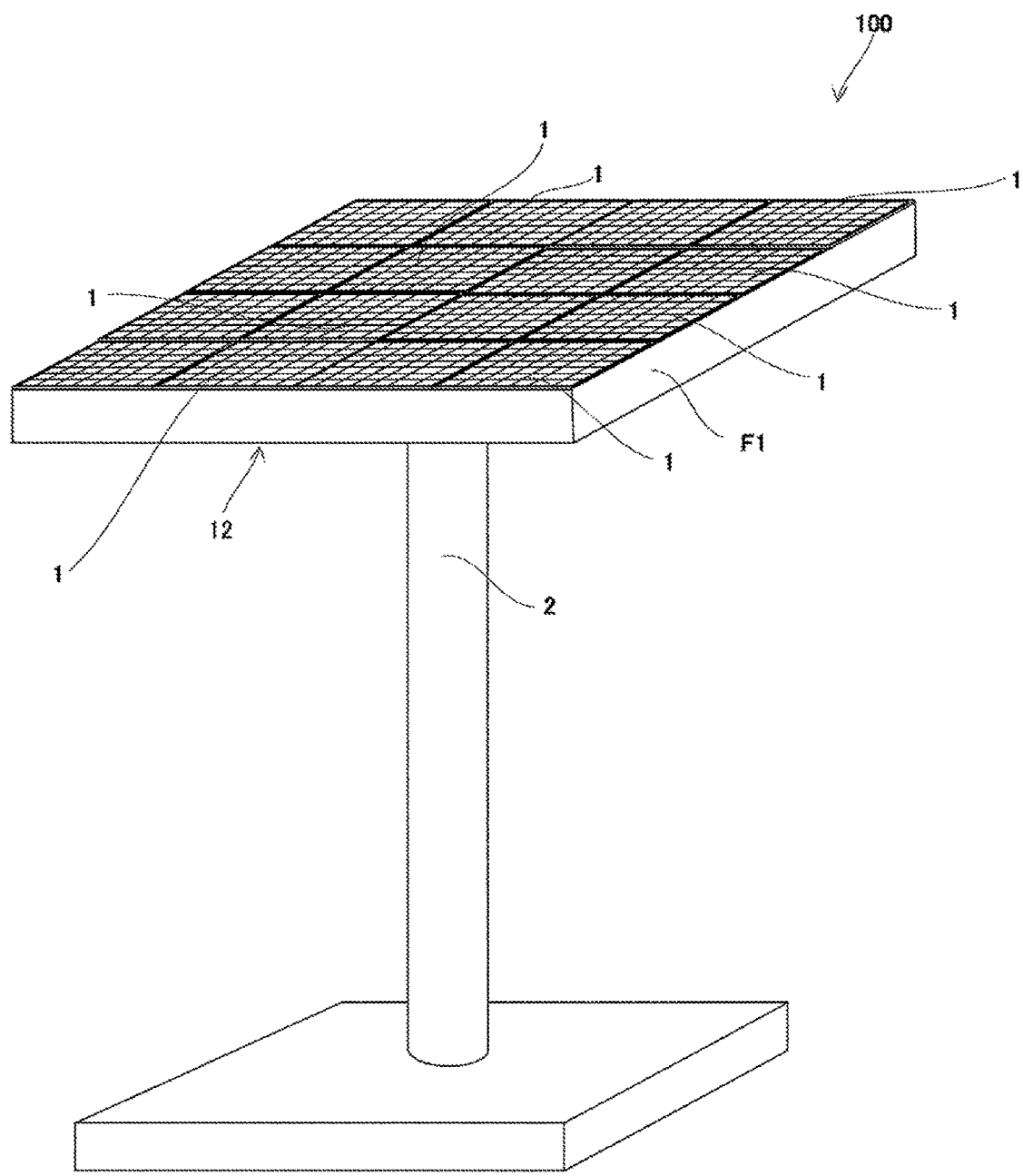
FIG. 1 is a perspective view showing the appearance of a photovoltaic apparatus according to a first embodiment.

The summary of embodiment of the present invention includes at least the following.

(1) A photovoltaic module according to an embodiment of the present invention includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion, wherein the side wall is formed from a resin and has at least one vent hole.

With such a configuration in which a vent hole is provided in a side wall of the housing, the temperature in the housing can be made close to air temperature, whereby excessive temperature increase can be suppressed. In addition, when the focal length of the lens changes in association with change in air temperature, the side wall formed from a resin also expands or contracts in association with the change in air temperature, whereby the distance between the lens and the power generating element changes. Thus, even when the focal length of the lens changes, a large decrease in the light amount of sunlight concentrating on the power generating element can be prevented, and decrease in the power generation efficiency of the photovoltaic module can be suppressed.

(2) In the photovoltaic module according to (1), when relative positional relationship between the concentrating portion and the bottom portion are correspondingly defined as upside and downside, an overhanging portion may be formed in a shape projecting from above the vent hole toward outside relative to the side wall and hanging downwardly outside the vent hole.

In this case, dust, water drops, foreign matter, and other things which come from above and the entry of which into the vent hole is not desired can be excluded by the overhanging portion.

(3) In the photovoltaic module according to (2), an upper face of the overhanging portion may be downwardly inclined.

In this case, attached dust easily slips off, and thus, dust is less likely to deposit on the upper face of the overhanging portion.

(4) In the photovoltaic module according to (2) or (3), the overhanging portion may be in a shape that hides a part of an upper portion of the vent hole.

In this case, the overhanging portion does not hide the entirety of the vent hole from the outside front thereof (i.e., there is some clearance in a lower portion thereof). Therefore, it is possible to realize both exclusion of dust, etc. by means of the overhanging portion, and good ventilation through the vent hole.

(5) The photovoltaic module according to (1) may include a foreign matter entry-suppressing portion configured to suppress entry of foreign matter into an interior space of the housing through the vent hole, wherein the foreign matter entry-suppressing portion includes a filter for the vent hole.

With such a configuration in which the vent hole is provided in the side wall of the housing, entry of foreign matter such as rainwater, water drops, or insects can be effectively suppressed, compared with a configuration in which the vent hole is provided in the upper face or the bottom face of the housing. Further, since the foreign matter entry-suppressing portion is provided, entry of foreign matter can be further reliably suppressed while air ventilation is ensured. Accordingly, a further excellent photovoltaic module can be provided.

(6) In the photovoltaic module according to (5), for example, the housing is fixed to a frame member, and the side wall is opposed to the frame member in a state where the housing is fixed to the frame member, and the foreign matter entry-suppressing portion includes a gap between the side wall and the frame member.

Thus, with the configuration does not allow foreign matter to enter the housing unless the foreign matter goes through the gap between the frame member and the side wall of the housing, entry of the foreign matter can be further suppressed. In addition, by using the gap between the frame member and the side wall of the housing as the foreign matter entry-suppressing portion, it is possible to suppress entry of foreign matter without additionally using a new member, and thus, it is possible to realize low cost.

(7) In the photovoltaic module according to (6), for example, the housing includes a flange configured to be in contact with the frame member in the state where the housing is fixed to the frame member, and the foreign matter entry-suppressing portion includes a gap formed by the side wall, the flange, and the frame member.

Thus, since the flange of the housing is in contact with the frame member, a part of the gap between the frame member and the side wall of the housing is blocked by the flange, whereby the entry path for foreign matter is further restricted. Accordingly, entry of foreign matter can be further suppressed.

(8) A photovoltaic module according to an embodiment of the present invention in another aspect includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion, wherein the side wall is formed from a resin and has at least one vent hole, and the housing includes a fitting portion capable of being fitted to the housing of another photovoltaic module.

With this configuration, by fitting the fitting portions of a plurality of the photovoltaic modules to each other, it is possible to couple the plurality of the photovoltaic modules to each other. This facilitates positioning for arranging the photovoltaic modules, and can realize prevention of erroneous arrangement and reduction of construction time for coupling the photovoltaic modules. In addition, associated with the reduction of the construction time, cost required for the construction can be reduced. Accordingly, a further excellent photovoltaic module can be provided.

(9) In the photovoltaic module according to (8), for example, the housing includes, as the fitting portion, a flange extending along an extending direction of an upper face or a bottom face of the housing, and the flange is capable of being fitted to the flange of the housing of the another photovoltaic module.

With this configuration, when a plurality of the photovoltaic modules are to be coupled to each other, it is possible to perform the construction while viewing the fitting portions, and thus, it is easy to perform the coupling work. In addition, by providing the fitting portion to the flange, it is possible to relatively easily manufacture the structure for fitting.

(10) In the photovoltaic module according to (9), a configuration may be employed in which: the flange is provided with a fixing portion for fixing the housing to a frame member to which a plurality of the photovoltaic modules are mounted side by side; and in a state where a plurality of the housings are fixed to the frame member, a plurality of the fixing portions respectively provided to the plurality of the flanges are arranged in one line along an extending direction of the frame member.

With this configuration, the work for fixing a plurality of the photovoltaic modules to the frame member can be efficiently performed.

(11) In the photovoltaic module according to any one of (8) to (10), for example, the fitting portion is provided to a face that includes either one of an upper face and a bottom face of the housing.

Suppose that the either one mentioned in (11) above is the "upper face", then, with this configuration, for example, in a case where the fixing portion for fixing the housing to the frame member is provided to the fitting portion, the work for fixing the housing to the frame member from above the housing can be performed in a state where the lens provided to the upper face of the housing faces upwardly, i.e., in the use state. Thus, for example, in such a case where a plurality of the photovoltaic modules are coupled to each other, and then the plurality of the photovoltaic modules are fixed all together to the frame member, it is possible to perform the work for fixing the housings to the frame member, without greatly changing the orientations of the coupled photovoltaic modules. Accordingly, the work can be easily performed.

Suppose that the either one mentioned in (11) above is the "bottom face", then, with this configuration, for example, in a case where the fixing portion for fixing the housing to the frame member is provided to the fitting portion, the work for fixing the housing to the frame member can be performed from below the housing. Thus, for example, in such a case where a plurality of the photovoltaic modules are individually fixed to the frame member before the photovoltaic modules are coupled to each other, it is possible to decrease the possibility that a tool being used in the work for fixing the housing to the frame member comes into contact with the lens provided to the upper face of the housing, for example. Accordingly, the work can be easily performed.

(12) In the photovoltaic module according to any one of (1) to (11), a configuration may be employed in which a shielding plate is provided so as to inwardly project along an inner face of the side wall, the shielding plate being configured to shield the inner face and the vent hole from concentrated sunlight when the concentrated sunlight is deviated from the power generating element.

According to this configuration, when concentrated sunlight is deviated from the power generating element, burnout of the inner face of the side wall and the filter provided at the vent hole can be prevented by the shielding plate.

(13) A photovoltaic panel according to an embodiment of the present invention includes: a panel housing in a dish-like shape partitioned into a plurality of sections by a frame member; and a plurality of photovoltaic modules respectively mounted in the sections, wherein each photovoltaic module includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion, and the side wall is formed from a resin and has at least one vent hole.

With such a configuration in which a vent hole is provided in a side wall of the housing, the temperature in the housing can be made close to air temperature, whereby excessive temperature increase can be suppressed. In addition, when the focal length of the lens changes in association with change in air temperature, the side wall formed from a resin also expands or contracts in association with the change in air temperature, whereby the distance between the lens and the power generating element changes. Thus, even when the focal length of the lens changes, a large decrease in the light amount of sunlight concentrating on the power generating element can be prevented, and decrease in the power generation efficiency of the photovoltaic module can be suppressed.

Even in the case of a photovoltaic module having a side wall made from a resin, such a photovoltaic module exhibits sufficient mechanical strength by being mounted to the panel housing.

[Details of Embodiments]

Hereinafter, embodiments of the present invention will be described with reference to the drawings. For convenience, the description will be separately given in Part 1 and Part 2 in accordance with the features to be focused.

Part 1 mainly relates to (1), (2), (5) to (11), and (13) above.

Part 2 mainly relates to (1) to (4), and (12) above.

However, the configuration described in Part 1 and the configuration described in Part 2 can be combined with each other as desired.

In the drawings, the same or corresponding components are denoted by the same reference signs. In each of Part 1 and Part 2, at least some parts of embodiments described below can be combined as desired.

Part 1

First Embodiment

[Configuration of Photovoltaic Apparatus]

Figure 2:
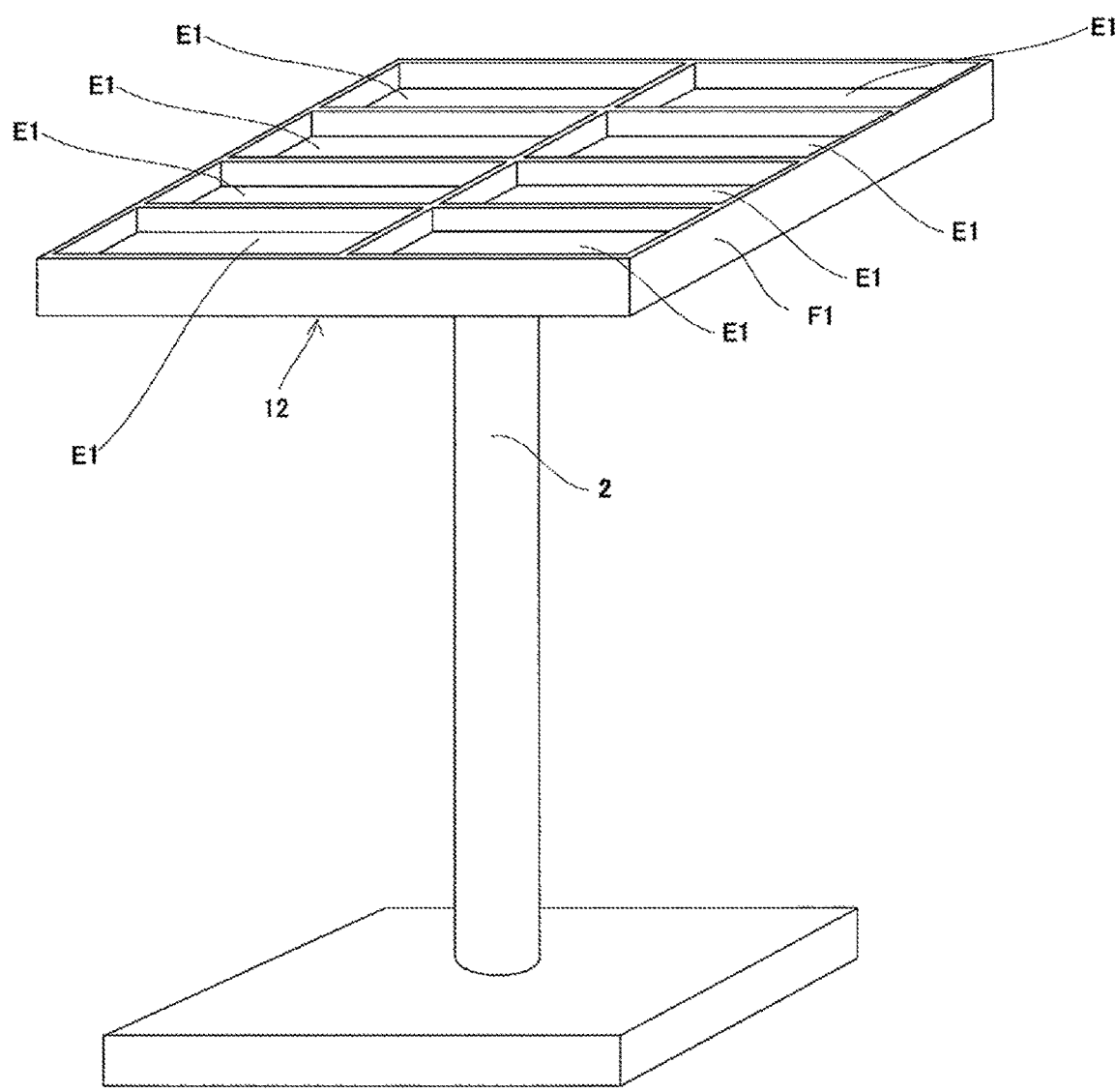
FIG. 2 is a perspective view showing a configuration of a pedestal shown in FIG. 1.

FIG. 1 is a perspective view showing the appearance of a photovoltaic apparatus according to a first embodiment. FIG. 2 is a perspective view showing a configuration of a pedestal shown in FIG. 1.

With reference to FIG. 1, a photovoltaic apparatus 100 includes a plurality of the photovoltaic modules 1 and a pedestal 2. The pedestal 2 includes a frame member F1, a sun azimuth meter C1 not shown, and a drive portion M1 not shown. The sun azimuth meter C1 includes a sensor for detecting the position of the sun. The plurality of the photovoltaic modules 1 are arranged side by side and fixed to the frame member F1.

The drive portion M1 recognizes the position of the sun on the basis of a signal outputted from the sun azimuth meter C1, and changes the orientation of the frame member F1 such that the light receiving faces of the photovoltaic modules 1 face the sun from the sunrise till sunset, for example.

With reference to FIG. 2, in the frame member F1 of the pedestal 2, a plurality of bars are provided so as to cross each other in the vertical direction and the horizontal direction of the frame member F1. One photovoltaic module 1 is inserted in each of rectangular parallelepiped (without upper face and with bottom face) housing portions E1 formed by the frame member F1. Each housing portion E1 shown in FIG. 2 is a rectangular parallelepiped, but the housing portion E1 may be a cube or the like.

A panel housing (entire frame) 12 having the plurality of housing portions E1 is in a dish-like shape partitioned into a plurality of sections (housing portions) by the frame member F1. Although side walls of the photovoltaic module described later are made from a resin, even such a photovoltaic module exhibits sufficient mechanical strength by being mounted to the panel housing 12.

[Configuration of Photovoltaic Module]

Figure 3:
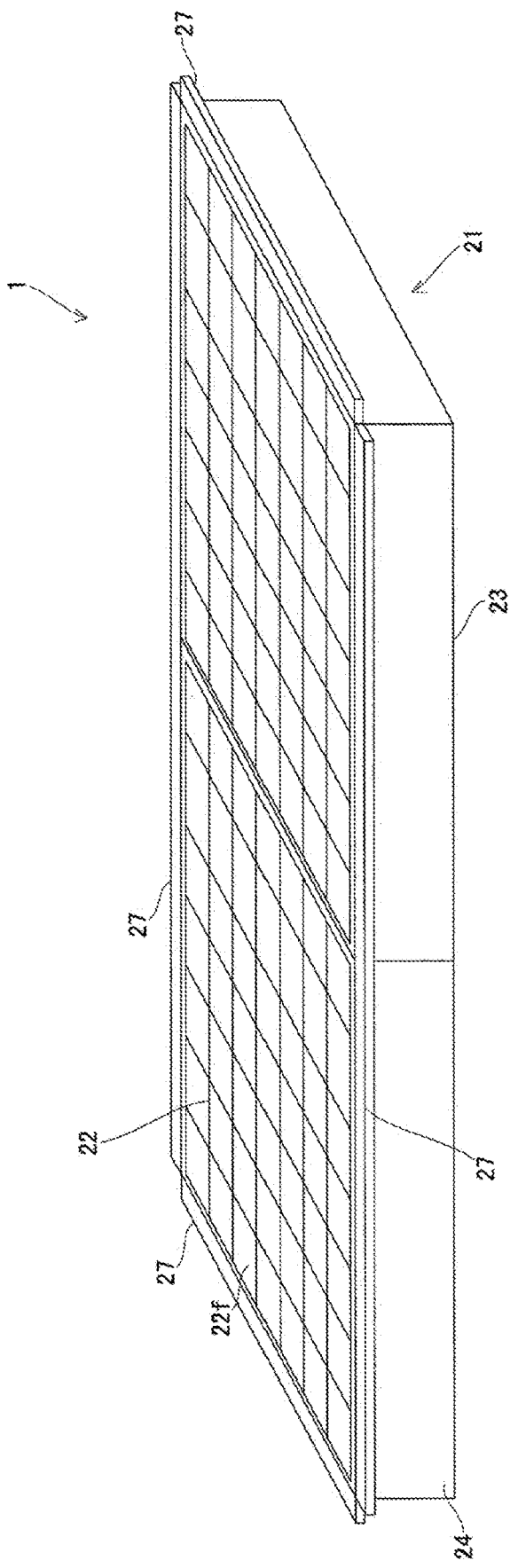
FIG. 3 is a perspective view showing the appearance of a photovoltaic module according to the first embodiment.
Figure 4:
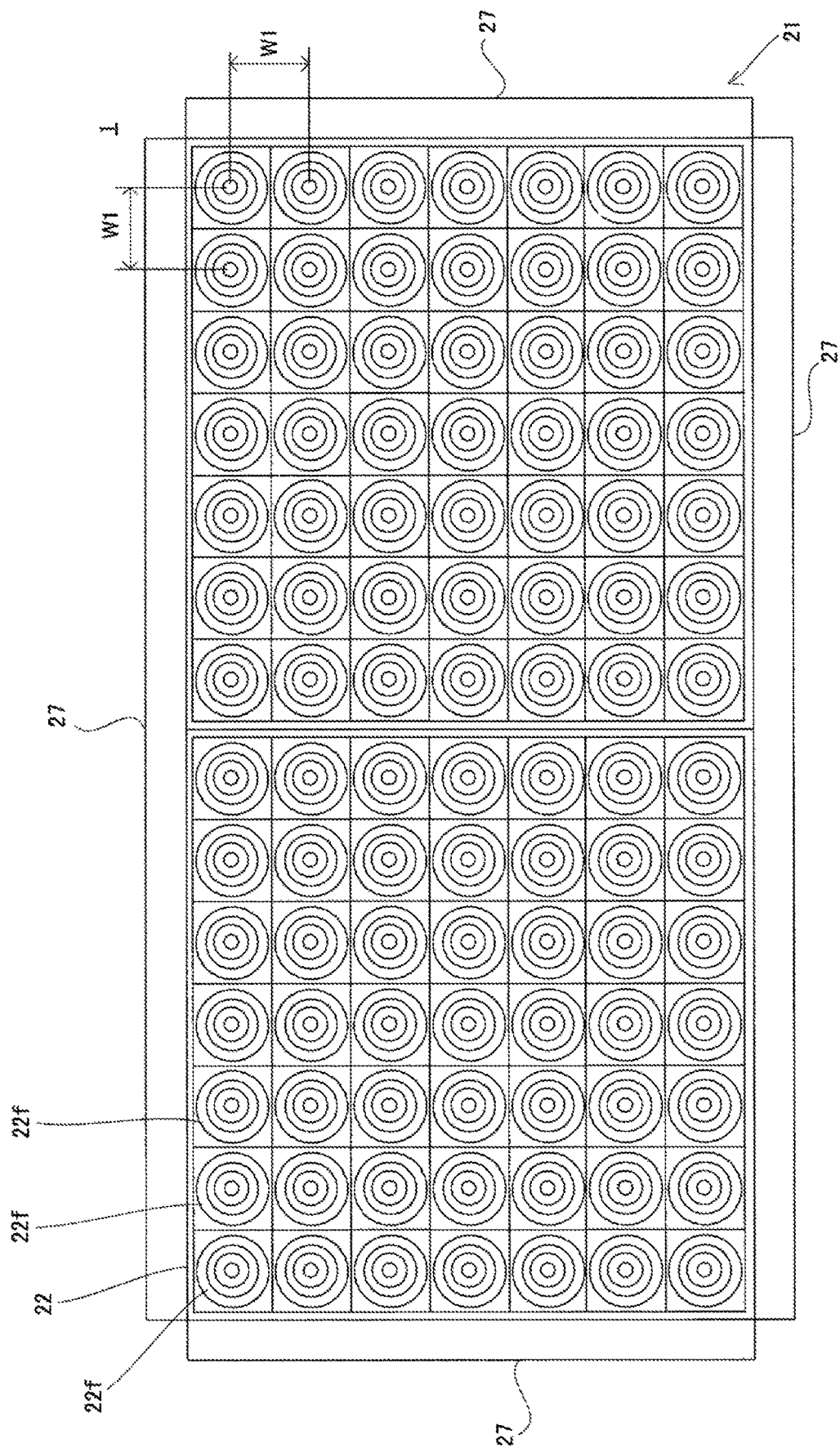
FIG. 4 is a plan view of the photovoltaic module according to the first embodiment.

FIG. 3 is a perspective view showing the appearance of a photovoltaic module according to the first embodiment. FIG. 4 is a plan view of the photovoltaic module according to the first embodiment.

With reference to FIG. 3 and FIG. 4, the photovoltaic module 1 includes a housing 21 formed from a resin and having a rectangular parallelepiped or cubic shape, for example. The housing 21 includes a bottom portion 23, side walls 24, a concentrating portion 22, and flanges 27.

The side walls 24 correspond to the side faces of the housing 21, respectively, and the concentrating portion 22 corresponds to the upper face of the housing 21. The concentrating portion 22 includes a plurality of Fresnel lenses 22$f$. Each flange 27 is provided at a part, of its corresponding side wall 24, on the concentrating portion 22 side along the longitudinal direction thereof, for example.

In the concentrating portion 22, the Fresnel lenses 22$f$ are arranged in a square lattice pattern, for example. Specifically, the Fresnel lenses 22$f$ are disposed such that the distances between the centers of the Fresnel lenses 22$f$ adjacent to each other are each W1, for example.

Figure 5:
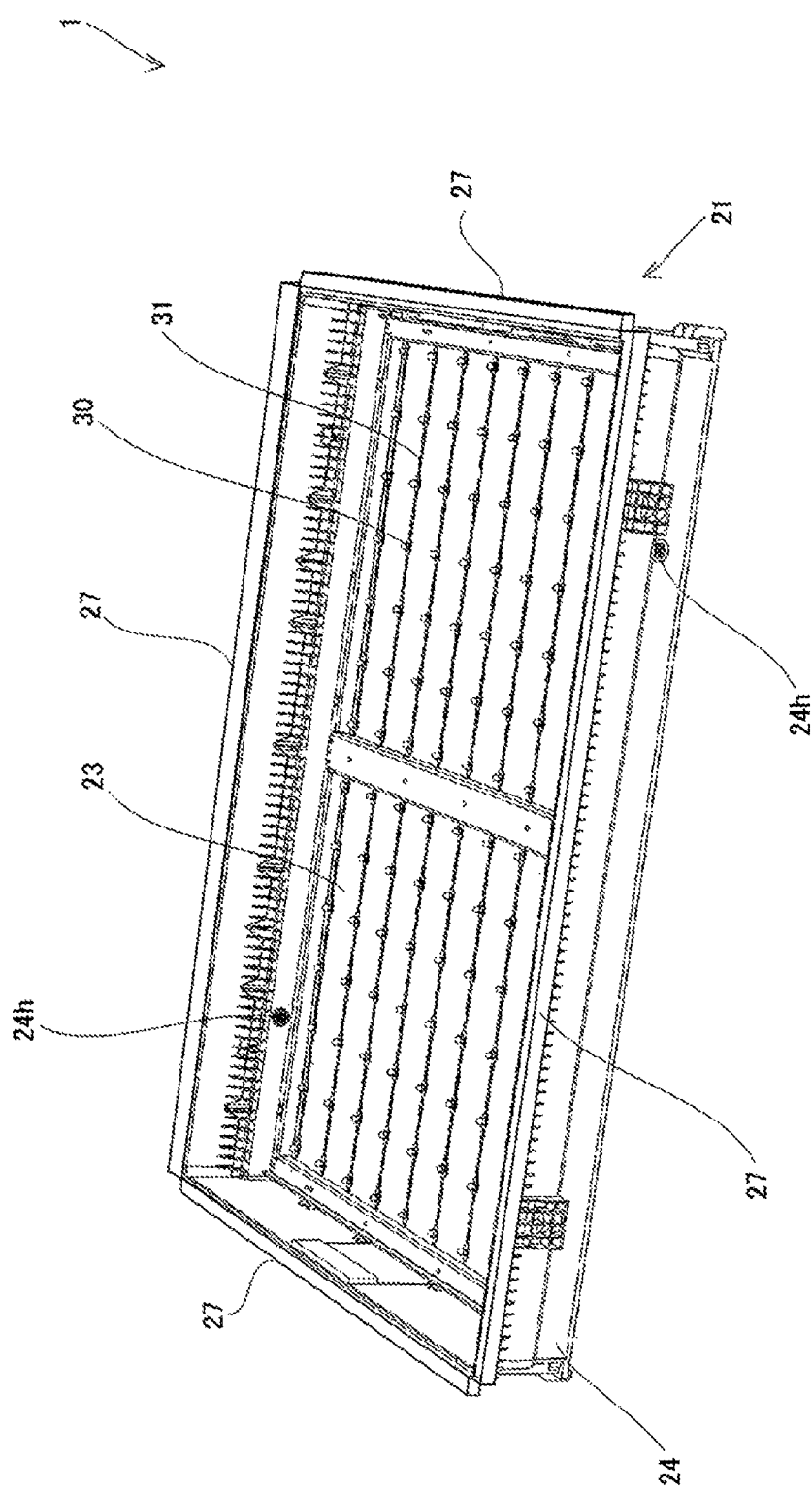
FIG. 5 is a perspective view showing a detailed configuration of a housing of the photovoltaic module according to the first embodiment.

FIG. 5 is a perspective view showing a detailed configuration of the housing of the photovoltaic module according to the first embodiment. In order to explain the configuration of the inside of the housing 21, FIG. 5 does not show the concentrating portion 22.

With reference to FIG. 5, the photovoltaic module 1 further includes a plurality of power generating elements 30 and a plurality of FPCs (flexible printed circuits) 31, in addition to the housing 21. The power generating elements 30 and the FPCs 31 are housed in the housing 21. Vent holes 24$h$ are formed in the side walls 24 of the housing 21.

The bottom portion 23 is formed of aluminium, for example. The plurality of FPCs 31 are arranged in parallel or in substantially parallel to each other in the bottom portion 23, and a plurality of the power generating elements 30 are mounted to each FPC 31. The power generating elements 30 are provided at positions that correspond to the Fresnel lenses 22$f$, respectively, and receive sunlight concentrated by their corresponding Fresnel lenses 22$f$ to generate power corresponding to an amount of received light.

As described above, the photovoltaic module 1 includes: the power generating elements 30 each configured to receive light to generate power; and the housing 21 which is closed and which houses the power generating elements 30. The housing 21 has: the concentrating portion 22 provided with the lenses (Fresnel lenses 220 configured to concentrate sunlight; the bottom portion 23 in which the power generating elements 30 are disposed; and the side walls 24 serving as the outer frame for the bottom portion 23 and supporting the concentrating portion 22.

Here, in some cases, the photovoltaic apparatus 100 is used in such a place where there is a large temperature difference. Thus, there are cases where the bottom portion 23 expands or contracts due to change in air temperature, thus causing change in the distances between the power generating elements 30 provided in the bottom portion 23 and the Fresnel lenses 22$f$ provided to the upper face of the housing 21.

Then, when the distance between a power generating element 30 and its corresponding Fresnel lens 22$f$ has changed, there is a possibility that the distance does not match the focal length of the Fresnel lens 22$f$ and sunlight cannot be efficiency concentrated. Therefore, it is demanded to prevent expansion and contraction of the bottom portion 23 due to change in air temperature.

In contrast, in the photovoltaic module 1 according to the present first embodiment, since the vent holes 24h are formed in the side walls 24, the inside of the housing 21 can be prevented from becoming a sealed space. That is, by generating an air flow in the housing 21, occurrence of a large change in the temperature inside the housing 21 can be suppressed, and thus, expansion and contraction of the bottom portion 23 can be prevented.

In this manner, with the configuration in which the vent holes 24h are provided in the side walls 24 of the housing 21, it is possible to make the temperature inside the housing 21 close to the air temperature, thereby being able to suppress excessive temperature increase.

As shown in FIG. 5, for example, one vent hole 24h is formed in each of the side walls 24 of the housing 21. It should be noted that, as long as a configuration is employed that allows an air flow to be generated in the housing 21, the number and the size of the vent holes 24h are not limited, and for example, the vent hole 24h may be formed in one side wall 24 among the side walls 24 of the housing 21.

If there are at least two vent holes in the entirety of the housing 21, a state with an inlet and an outlet for air is realized, and thus, such a configuration is preferable. However, even if there is only one vent hole in the entirety of the housing 21, the inside of the housing 21 is prevented from becoming a sealed space, and thus, the pressure balance between the inside air of the housing and the outside air can be maintained. In addition, by devising the shape and the opening area of the vent hole, it is possible to ensure the minimum ventilation.

In FIG. 5, the flange 27 is provided for the entirety in the longitudinal direction of each side wall 24 of the housing 21, that is, the flange 27 is provided for the entirety of the edge of the side wall 24, but the flange 27 may be provided for a part of the longitudinal direction of the side wall 24.

Figure 6:
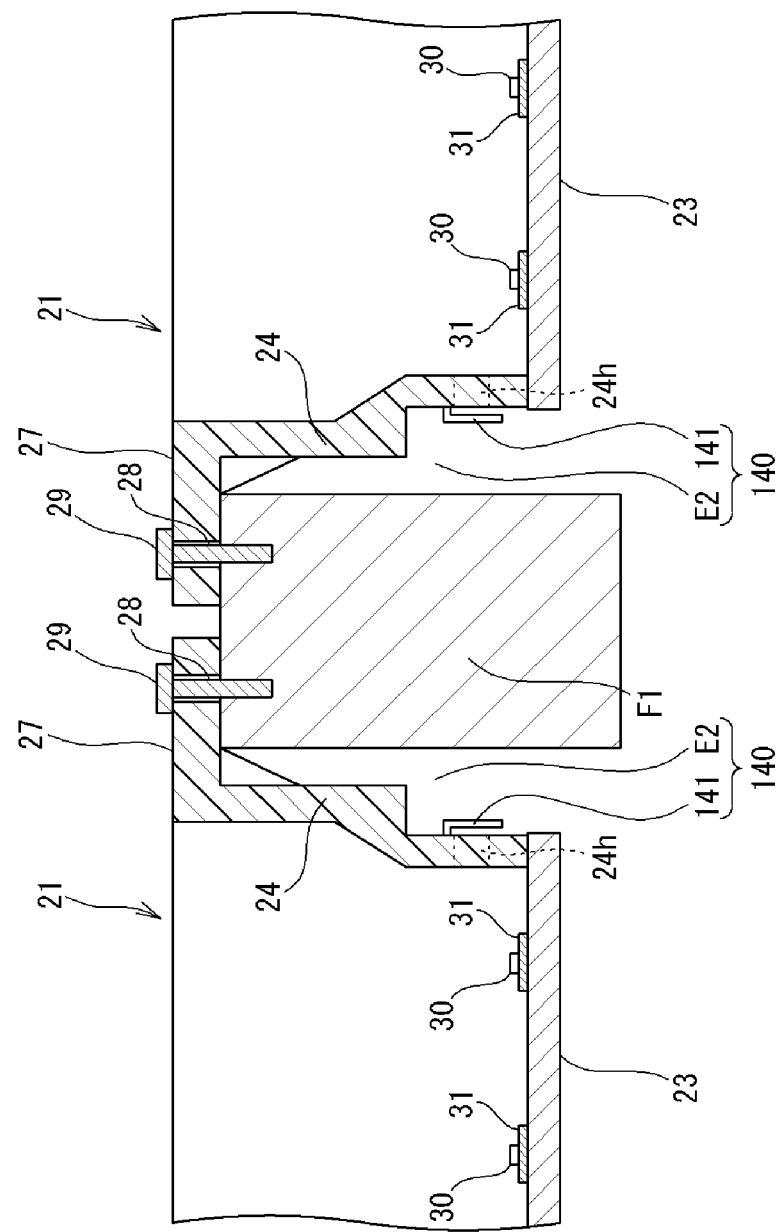
FIG. 6 is a cross-sectional view for describing a state where the housing of the photovoltaic module according to the first embodiment is mounted to a frame member.

FIG. 6 is a cross-sectional view for describing a state in which the housing of the photovoltaic module according to the first embodiment is mounted to the frame member.

With reference to FIG. 6, in a state where the housing 21 of each photovoltaic module 1 is inserted in the its corresponding housing portion E1 formed by the frame member F1, the flange 27 of the housing 21 comes into contact with the upper face of the frame member F1. Then, in this state, a bolt 29 is inserted in a mounting hole 28 formed in the flange 27, for example, whereby the housing 21 is fixed to the frame member F1.

Not limited to the configuration in which the housing 21 is fixed to the frame member F1 by the bolt 29 being inserted into the mounting hole 28, the housing 21 may be fixed to the frame member F1 by another method.

The photovoltaic module 1 further includes a foreign matter entry-suppressing portion 140 for suppressing foreign matter such as rainwater, water drops, or insects, from entering the inside of the housing 21 through the vent holes 24h.

The foreign matter entry-suppressing portion 140 includes: an exterior-side cover (cover) 141 covering at least a part of the vent hole 24h on the exterior side of the housing 21; and a filter (not shown) covering the vent hole 24h and allowing air ventilation through the vent hole 24h.

Further, a gap E2 is formed between the side wall 24 and the frame member F1 that are opposed to each other in a state where the housing 21 is fixed to the frame member F1. The foreign matter entry-suppressing portion 140 further includes the gap E2, in addition to the exterior-side cover 141 and the filter.

Preferably, the width of the gap E2 is small in order to suppress entry of foreign matter into the inside of the housing 21 through the vent hole 24h, and is 1 mm, for example. In FIG. 6, an upper portion of the gap E2 is blocked by the flange 27, but the gap E2 may not be necessarily blocked by the flange 27.

For example, in order to effectively prevent entry of rainwater through the vent hole 24h, the exterior-side cover 141 is provided so as to block the vent hole 24h from above the vent hole 24h. The shape of the exterior-side cover 141 is not limited to the shape as shown in FIG. 6, and for example, the exterior-side cover 141 may be formed in a labyrinth structure, that is, in a shape in which a plurality of layers are provided in an overlapping manner such that the path from outside the housing 21 to the vent hole 24h is complicated. In a case where the exterior-side cover 141 is formed in such a shape, entry of foreign matter can be more effectively prevented.

The filter is fusion-bonded to the surrounding region of the vent hole 24h from the interior side of the housing 21, so as to cover the entirety of the vent hole 24h, for example. Accordingly, the filter can be brought into close contact with the surrounding region of the vent hole 24h in a relatively simple manner.

[Detailed Configuration of Vent Hole]

Figure 7:
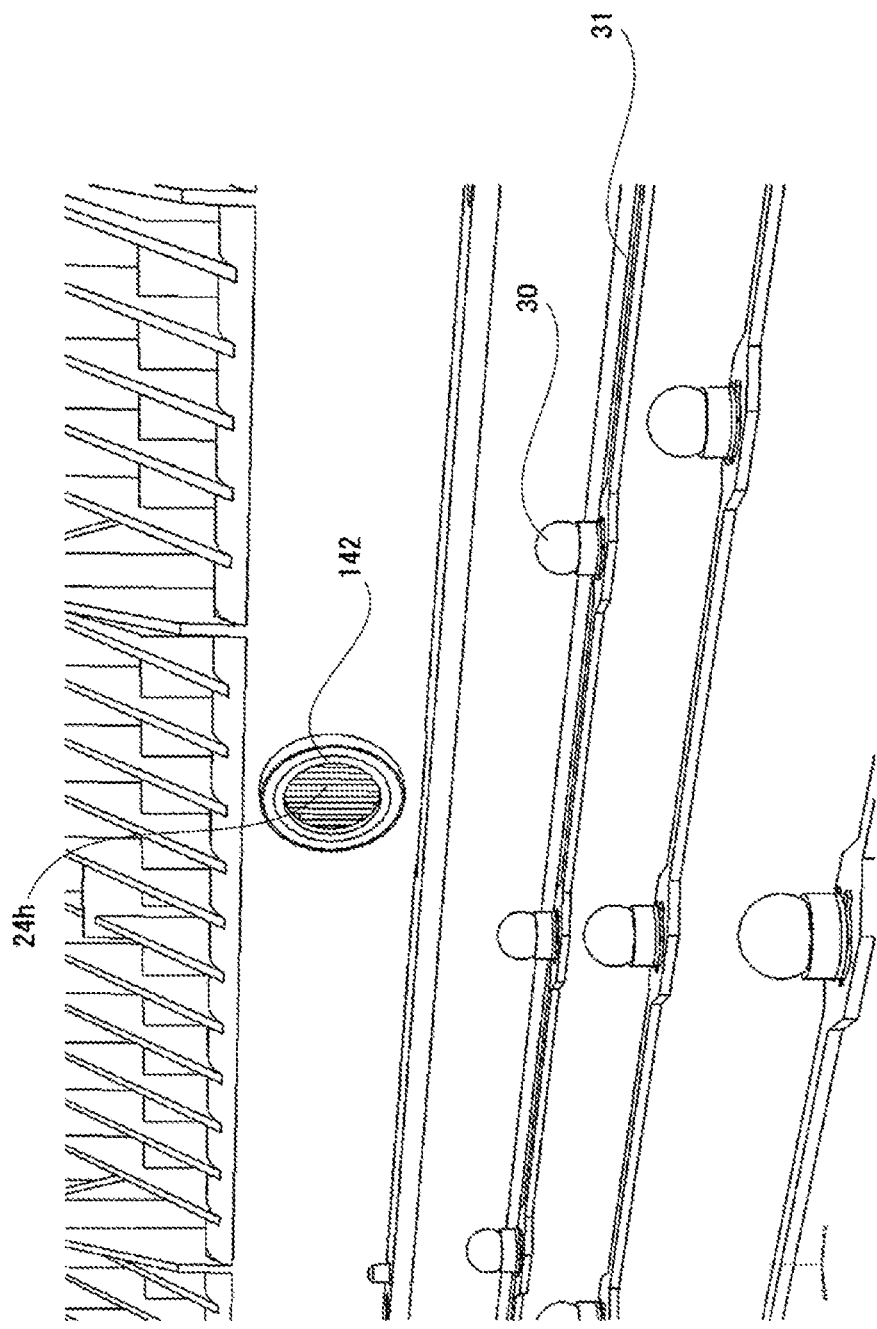
FIG. 7 is an enlarged view of a vent hole shown in FIG. 5.

FIG. 7 is an enlarged view of the vent hole shown in FIG. 5.

With reference to FIG. 7, the foreign matter entry-suppressing portion 140 further includes a filter 142 which covers at least a part of the vent hole 24h on the interior side of the housing 21.

The filter 142 is resin-molded into a mesh form, for example. Specifically, the filter 142 is molded integrally with the side wall 24 of the housing 21, by injection molding using a tetrafluoroethylene resin (PTFE) or the like which has excellent chemical resistance and excellent heat resistance.

The foreign matter entry-suppressing portion 140 may include only either one of the exterior-side cover 141 and the filter 142. Alternatively, the foreign matter entry-suppressing portion 140 may include neither the exterior-side cover 141 nor the filter 142 and include only the gap E2.

Meanwhile, in the concentrator photovoltaic unit described in PATENT LITERATURE 3, in order to prevent foreign matter such as rainwater or dust from entering the inside of the long-sized frame through the vent holes provided at the end portions of the long-sized frame, vent hole covering portions which cover the vent holes are provided.

However, even with such a configuration, since the vent holes are formed in the bottom face of the long-sized frame, there is a possibility that entry of foreign matter from above cannot be sufficiently prevented. Such entry of foreign matter could cause, for example, impaired performance of the concentrator photovoltaic unit.

In contrast, the photovoltaic module 1 according to the first embodiment includes the power generating elements 30, and the housing 21 in which the power generating elements 30 are housed. In addition, the vent hole 24h is formed in the side wall 24 of the housing 21. Further, the photovoltaic module 1 includes the foreign matter entry-suppressing portion 140 configured to suppress entry of foreign matter into the interior space of the housing 21 through the vent hole 24h.

Thus, with the configuration in which the vent hole 24h is provided in the side wall 24 of the housing 21, entry of foreign matter such as rainwater, water drops, or insects can be effectively suppressed, compared with a configuration in which the vent hole is provided in the upper face or the bottom portion 23 of the housing 21. Further, since the foreign matter entry-suppressing portion 140 is provided, entry of foreign matter can be further reliably suppressed while air ventilation is ensured. Accordingly, a further excellent photovoltaic module can be provided.

In the photovoltaic module 1 according to the first embodiment, each housing 21 is fixed to the frame member F1. In addition, in a state where the housing 21 is fixed to the frame member F1, the side wall 24 of the housing 21 is opposed to the frame member F1, and the foreign matter entry-suppressing portion 140 includes the gap E2 between the frame member F1 and the side wall 24 of the housing 21.

Thus, with the configuration does not allow foreign matter to enter the housing 21 unless the foreign matter goes through the gap E2 between the frame member F1 and the side wall 24 of the housing 21, entry of the foreign matter can be further suppressed. In addition, by using the gap E2 between the frame member F1 and the side wall 24 of the housing 21 as the foreign matter entry-suppressing portion 140, it is possible to suppress entry of foreign matter without additionally using a new member, and thus, it is possible to realize low cost.

In the photovoltaic module 1 according to the first embodiment, the housing 21 includes the flange 27 which is in contact with the frame member F1 in a state where the housing 21 is fixed to the frame member F1. The foreign matter entry-suppressing portion 140 includes the gap E2 formed by the frame member F1, the flange 27, and the side wall 24 of the housing 21.

Thus, since the flange 27 of the housing 21 is in contact with the frame member F1, a part of the gap E2 between the frame member F1 and the side wall 24 of the housing 21 is blocked by the flange 27, whereby the entry path for foreign matter is further restricted. Accordingly, entry of foreign matter can be further suppressed.

In the photovoltaic module 1 according to the first embodiment, the foreign matter entry-suppressing portion 140 includes the filter 142, and the exterior-side cover 141 which covers at least a part of the vent hole 24h.

With this configuration, entry of foreign matter can be further suppressed in a reliable and simple manner.

In the photovoltaic module 1 according to the first embodiment, at least a part of the housing 21 is formed from a resin.

With this configuration, the housing having the vent hole 24h formed therein can be manufactured at low cost by injection molding or the like, for example.

Next, another embodiment will be described with reference to the drawings. The same or corresponding components are denoted by the same reference signs, and the description there of is not repeated.

Second Embodiment

The photovoltaic module 1 according to a second embodiment includes a structure capable of being fitted to the housing 21 of another photovoltaic module 1. Here, features that are different from those of the photovoltaic module 1 according to the first embodiment described above will be mainly described.

Figure 8:
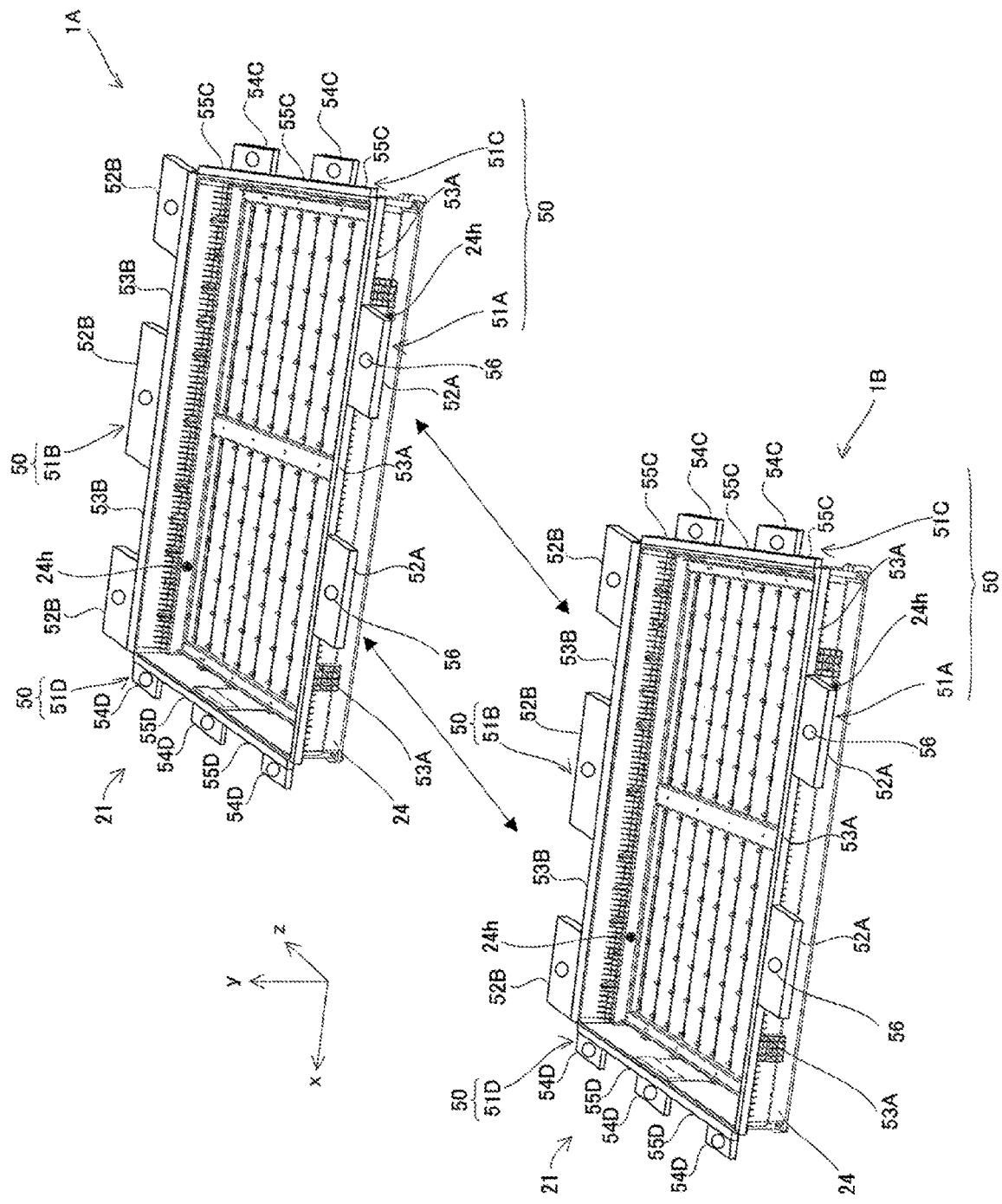
FIG. 8 is a perspective view showing a detailed configuration of the housing of the photovoltaic module according to a second embodiment.
Figure 9:
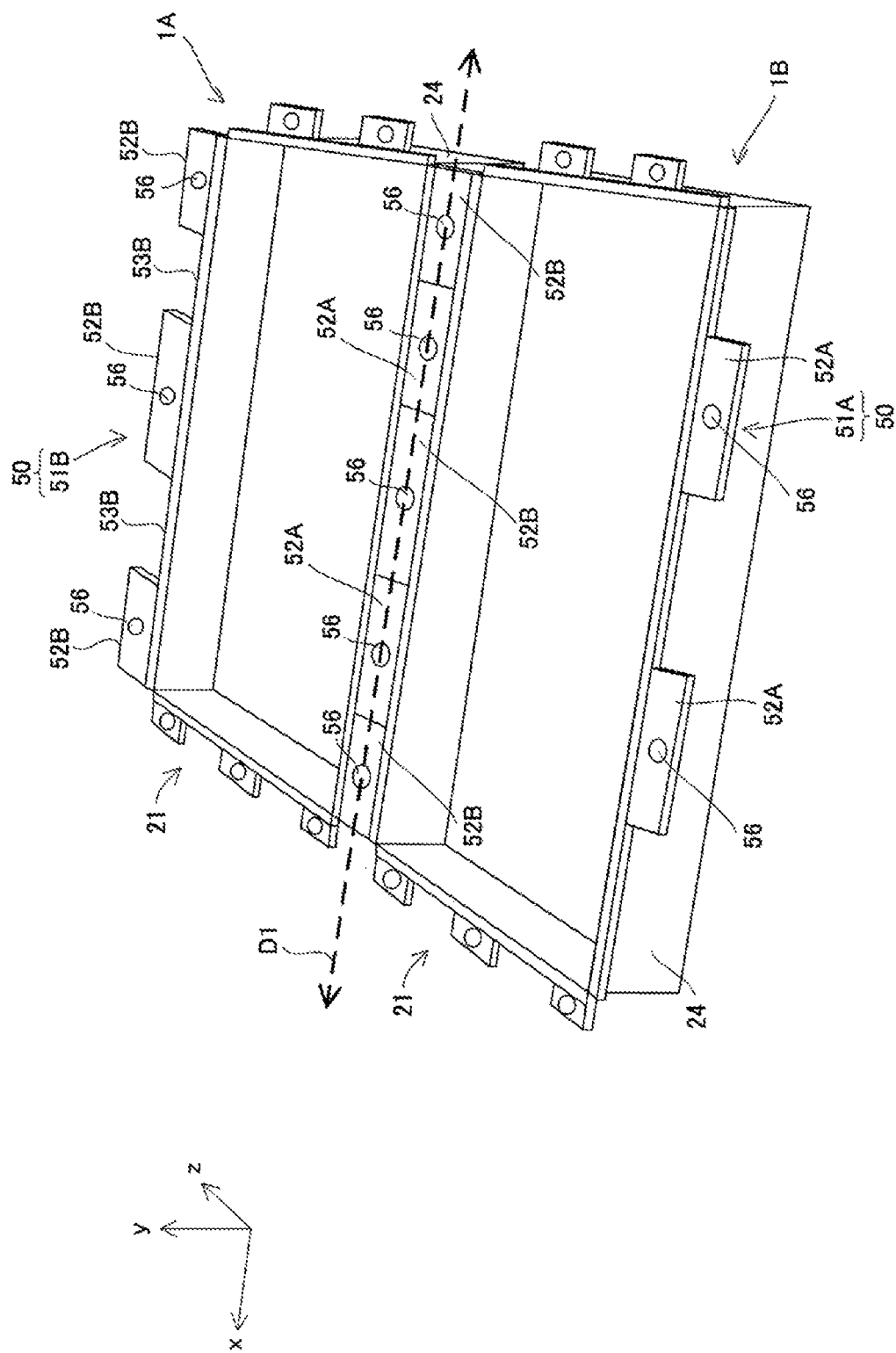
FIG. 9 is a perspective view showing a state where a plurality of the photovoltaic modules shown in FIG. 8 are coupled to each other.
Figure 10:
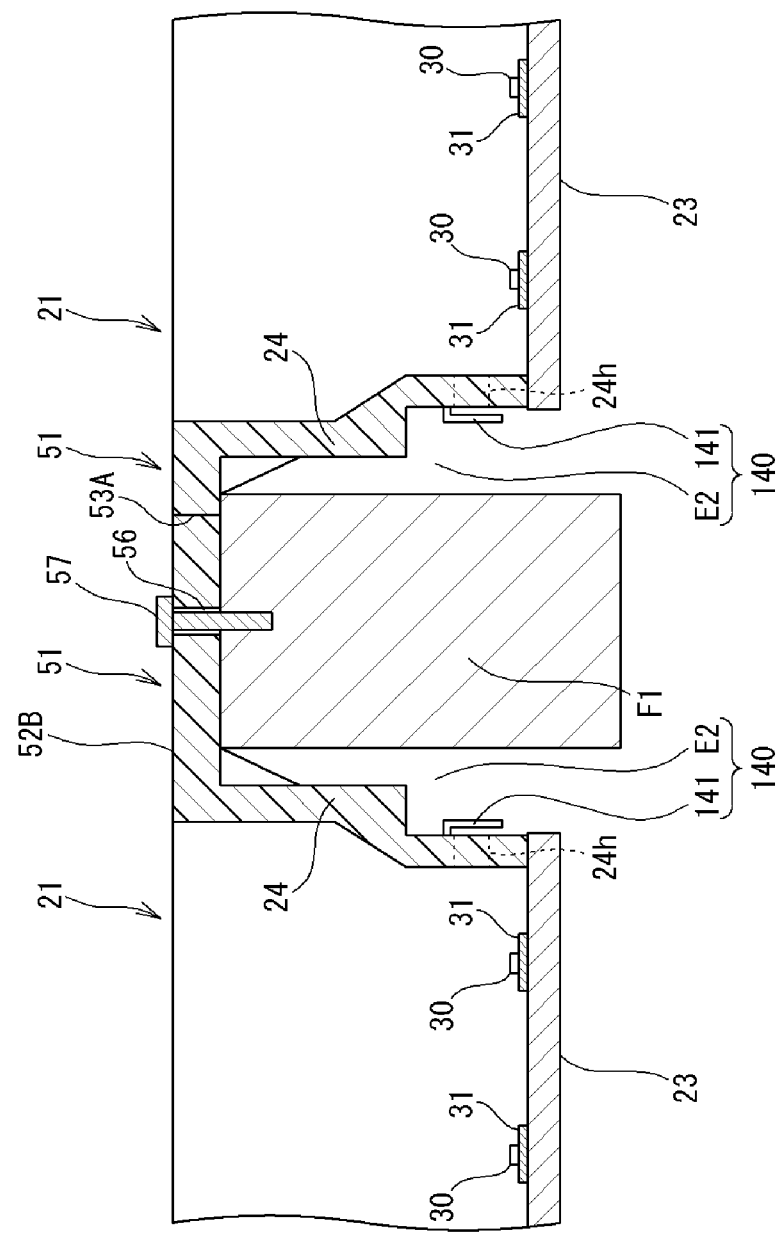
FIG. 10 is a cross-sectional view for describing a state (No. 1) where a housing of a photovoltaic module according to the second embodiment is mounted to a frame member.

FIG. 8 is a perspective view showing a detailed configuration of the housing of the photovoltaic module according to a second embodiment. FIG. 9 is a perspective view showing a state in which a plurality of the photovoltaic modules shown in FIG. 8 are coupled to each other. FIG. 10 is a cross-sectional view for describing a state (No. 1) in which the housing of the photovoltaic module according to the second embodiment is mounted to the frame member.

In FIG. 8, the concentrating portions 22 are not shown. In FIG. 9, the vent holes 24h, the concentrating portions 22, the power generating elements 30, and the FPCs 31 are not shown.

With reference to FIG. 8 to FIG. 10, compared with the housing 21 according to the first embodiment described above, the housing 21 of the photovoltaic module 1 includes, instead of the flanges 27, a fitting portion 50 capable of being fitted to the housing 21 of another photovoltaic module 1. Specifically, the housing 21 includes, as the fitting portion 50, a plurality of flanges 51 which extend along the extending direction of the upper face of the housing 21.

Each flange 51 has the same configuration as that of the flange 27 of the housing 21 according to the first embodiment described above, except that the contents described below. Hereinafter, with respect to the flange 51, features that are different from those of the flange 27 will be mainly described.

That is, the housing 21 includes, in the face that includes the upper face thereof, a plurality of the flanges 51 opposed to each other in the horizontal direction via the upper face. These opposed flanges 51 are in asymmetry with each other, and have shapes capable of being fitted to each other.

For example, among the flanges 51, a flange 51A provided to the side wall 24 that is on the nearer side in the z-axis direction shown in FIG. 8 has: two protruding portions 52A protruding along a direction parallel to or substantially parallel to the upper face of the housing 21; and three recessed portions 53A provided on both sides of each protruding portion 52A. In addition, among the flanges 51, a flange 51B provided to the side wall 24 on the farther side in the z-axis direction shown in FIG. 8 has: three protruding portions 52B protruding along a direction parallel to or substantially parallel to the upper face of the housing 21; and two recessed portions 53B provided between the corresponding protruding portions 52B.

Then, as shown in FIG. 9, among the plurality of the photovoltaic modules 1 that are adjacent to each other, for example, the two protruding portions 52A of the flange 51A of the photovoltaic module 1A abut against the two recessed portions 53B of the flange 51B of the photovoltaic module 1B, respectively, whereby the flange 51A and the flange 51B are fitted to each other. Accordingly, the photovoltaic module 1A and the photovoltaic module 1B are coupled to each other.

As shown in FIG. 8, for example, among the flanges 51, a flange 51C provided to the side wall 24 on the nearer side in the x-axis direction shown in FIG. 8 has: two protruding portions 54C protruding along a direction parallel to or substantially parallel to the upper face of the housing 21; and three recessed portions 55C provided on both sides of the each protruding portion 54C. In addition, among the flanges 51, a flange 51D provided to the side wall 24 on the farther side in the x-axis direction shown in FIG. 8 has: three protruding portions 54D protruding along a direction parallel to or substantially parallel to the upper face of the housing 21; and two recessed portions 55D provided between the corresponding protruding portions 54D.

Then, among the plurality of the photovoltaic modules 1 that are adjacent to each other, the two protruding portions 54C of the flange 51C of one photovoltaic module 1 abut against the two recessed portions 55D of the flange 51D of another photovoltaic module 1, respectively, whereby the flange 51C and the flange 51D are fitted to each other. Accordingly, the plurality of the photovoltaic modules 1 are coupled to each other.

It should be noted that the protruding portions 52A, 52B, 54C, and 54D, and the recessed portions 53A, 53B, 55C, and 55D of the flanges 51 are molded integrally with the side walls 24 of the housing 21 by injection molding, for example.

In addition, for example, in each of the protruding portions 52A, 52B, 54C, and 54D of the flanges 51, a mounting hole (fixing portion) 56 for fixing the housing 21 to the frame member F1 is formed. Then, as shown in FIG. 10, in a state where the flanges 51 of the plurality of the photovoltaic modules 1 are in contact with the upper face of the frame member F1, bolts 57 are respectively inserted in the plurality of the mounting holes 56 respectively formed in the protruding portions 52A, 52B, 54C, and 54D of the flanges 51. Accordingly, the housings 21 of the respective photovoltaic modules 1 are fixed to the frame member F1 of the pedestal 2.

Then, in a state where the housings 21 are fixed to the frame member F1 in this manner, as shown in FIG. 9, for example, the mounting hole 56 in each protruding portion 52A of the flange 51A and the mounting hole 56 in each protruding portion 52B of the flange 51B are alternately arranged in one line along an extending direction D1 of the frame member F1.

Figure 11:
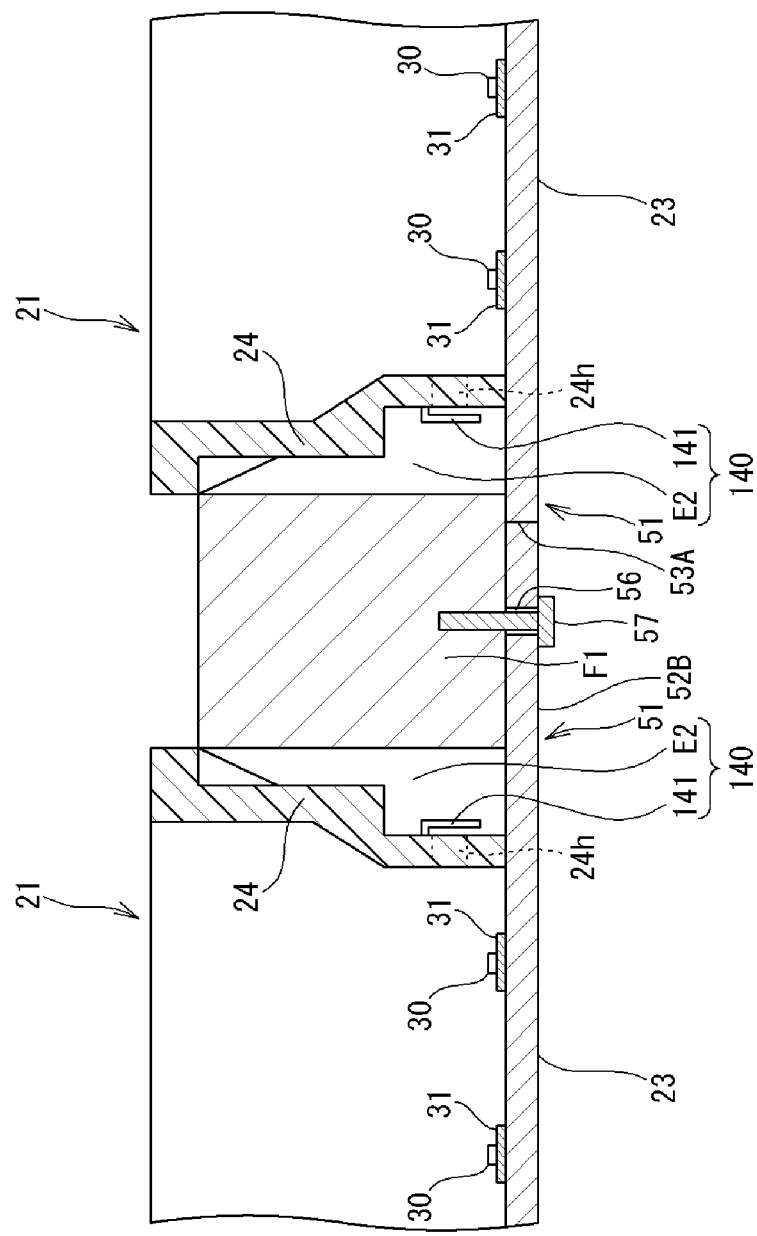
FIG. 11 is a cross-sectional view for describing a state (No. 2) where the housing of the photovoltaic module according to the second embodiment is mounted to the frame member.

FIG. 11 is a cross-sectional view for describing a state (No. 2) in which the housing of the photovoltaic module according to the second embodiment is mounted to the frame member.

Instead of the flanges 51 provided in the face that includes the upper face of the housing 21, the housing 21 may include, as the fitting portion 50, a plurality of flanges 51 opposed to each other via the bottom portion 23, in the face that includes the bottom portion 23 of the housing 21.

In such a configuration, as shown in FIG. 11, for example, in a state where the flanges 51 of the plurality of the photovoltaic modules 1 are in contact with the lower face of the frame member F1, the bolts 57 are respectively inserted in the plurality of the mounting holes 56 respectively formed in the protruding portions 52A, 52B, 54C, and 54D, of the flanges 51. Accordingly, the housings 21 of the photovoltaic modules 1 are fixed to the frame member F1 of the pedestal 2.

The other configurations are the same as those of the photovoltaic apparatus 100 according to the first embodiment described above, and thus, detailed description thereof is not repeated here.

Meanwhile, in the concentrator solar generator described in PATENT LITERATURE 4, a plurality of concentrator power generation modules are arranged side by side on a receiving base. However, the arrangement position of each concentrator power generation module is not clear. Thus, there is a risk that much time is required in the arrangement work, or that the concentrator power generation module is arranged at an erroneous position.

In contrast, the photovoltaic module 1 according to the second embodiment includes the power generating elements 30, and the housing 21 in which the power generating elements 30 are housed. In addition, the housing 21 includes the fitting portion 50 capable of being fitted to the housing 21 of another photovoltaic module 1.

With this configuration, by fitting the plurality of the photovoltaic modules 1 to each other, it is possible to couple the plurality of the photovoltaic modules 1 to each other. This facilitates positioning for arranging the photovoltaic modules 1, and can realize prevention of erroneous arrangement and reduction of work time for coupling the photovoltaic modules 1. In addition, associated with the reduction of the work time, cost required for the construction can be reduced. Accordingly, a further excellent photovoltaic module can be provided.

In the photovoltaic module 1 according to the second embodiment, the housing 21 includes, as the fitting portion 50, the flanges 51 which extend along the extending direction of the upper face or the bottom portion 23 of the housing 21. In addition, the flanges 51 can be fitted to the flanges 51 of the housing 21 of another photovoltaic module 1.

With this configuration, when a plurality of the photovoltaic modules 1 are to be coupled to each other, it is possible to perform the construction while viewing the fitting portions 50, and thus, it is easy to perform the coupling work. In addition, by providing the fitting portion 50 to the flanges 51, it is possible to relatively easily manufacture the structure for fitting.

In the photovoltaic module 1 according to the second embodiment, the housing 21 has a rectangular parallelepiped or cubic shape. In addition, the flanges 51 opposed to each other in the housing 21 have shapes capable of being fitted to each other.

With this configuration, by fitting the flanges 51 to those provided in another photovoltaic module 1, respectively, it is possible to couple the plurality of the photovoltaic modules 1, arranged in one line.

In the photovoltaic module 1 according to the second embodiment, the flanges 51 have formed therein the mounting holes 56 for fixing the housing 21 to the frame member F1 to which a plurality of the photovoltaic modules 1 are mounted side by side. In addition, in a state where a plurality of the housings 21 are fixed to the frame member F1, a plurality of the mounting holes 56 respectively provided in a plurality of the flanges 51 are arranged in one line along the extending direction of the frame member F1.

With this configuration, the work for fixing a plurality of the photovoltaic modules 1 to the frame member F1 can be efficiently performed.

In photovoltaic module 1 according to the second embodiment, at least a part of the housing 21 is formed from a resin.

With this configuration, the side walls 24 of the housing 21 and the fitting portion 50 included in the housing 21 can be integrally molded at low cost by injection molding or the like, for example.

In the photovoltaic module 1 according to the second embodiment, the fitting portion 50 is provided to the face that includes the upper face of the housing 21.

With this configuration, for example, in a case where the mounting holes 56 for fixing the housing 21 to the frame member F1 are formed in the fitting portion 50, the work for fixing the housing 21 to the frame member F1 from above the housing 21 can be performed in a state where the lenses provided to the upper face of the housing 21 face upwardly, i.e., in the use state. Thus, for example, in such a case where a plurality of the photovoltaic modules 1 are coupled to each other, and then, the plurality of the photovoltaic modules 1 are fixed all together to the frame member F1, it is possible to perform the work for fixing the housings 21 to the frame member F1, without greatly changing the orientations of the coupled photovoltaic modules 1. Accordingly, the work can be easily performed.

In the photovoltaic module 1 according to the second embodiment, the fitting portion 50 may be provided to a face that includes the bottom face of the housing 21.

With this configuration, for example, in a case where the mounting holes 56 for fixing the housing 21 to the frame member F1 are formed in the fitting portion 50, the work for fixing the housing 21 to the frame member F1 can be performed from below the housing 21. Thus, for example, in such a case where a plurality of the photovoltaic modules 1 are individually fixed to the frame member F1 before the photovoltaic modules 1 are coupled to each other, it is possible to decrease the possibility that a tool being used in the work for fixing the housing 21 to the frame member F1 comes into contact with the lenses provided to the upper face of the housing 21, for example. Accordingly, the work can be easily performed.

The above description includes the features in the additional notes below.

[Additional Note 1]

A photovoltaic module comprising:

a power generating element; and a housing in which the power generating element is housed, wherein a vent hole is formed in a side wall of the housing, the photovoltaic module further comprises a foreign matter entry-suppressing portion configured to suppress entry of foreign matter into an interior space of the housing through the vent hole, a Fresnel lens is provided to an upper face of the housing, and the power generating element is provided to a bottom face of the housing, and the side wall of the housing is formed from a resin, and the vent hole is molded integrally with the side wall of the housing by injection molding.

[Additional Note 2]

A photovoltaic module comprising:

a power generating element; and a housing in which the power generating element is housed, wherein the housing includes a fitting portion capable of being fitted to the housing of another photovoltaic module, a Fresnel lens is provided to an upper face of the housing, and the power generating element is provided to a bottom face of the housing, and the side wall of the housing is formed from a resin, and the fitting portion is molded integrally with the side wall of the housing by injection molding.

Part 2

Figure 12:
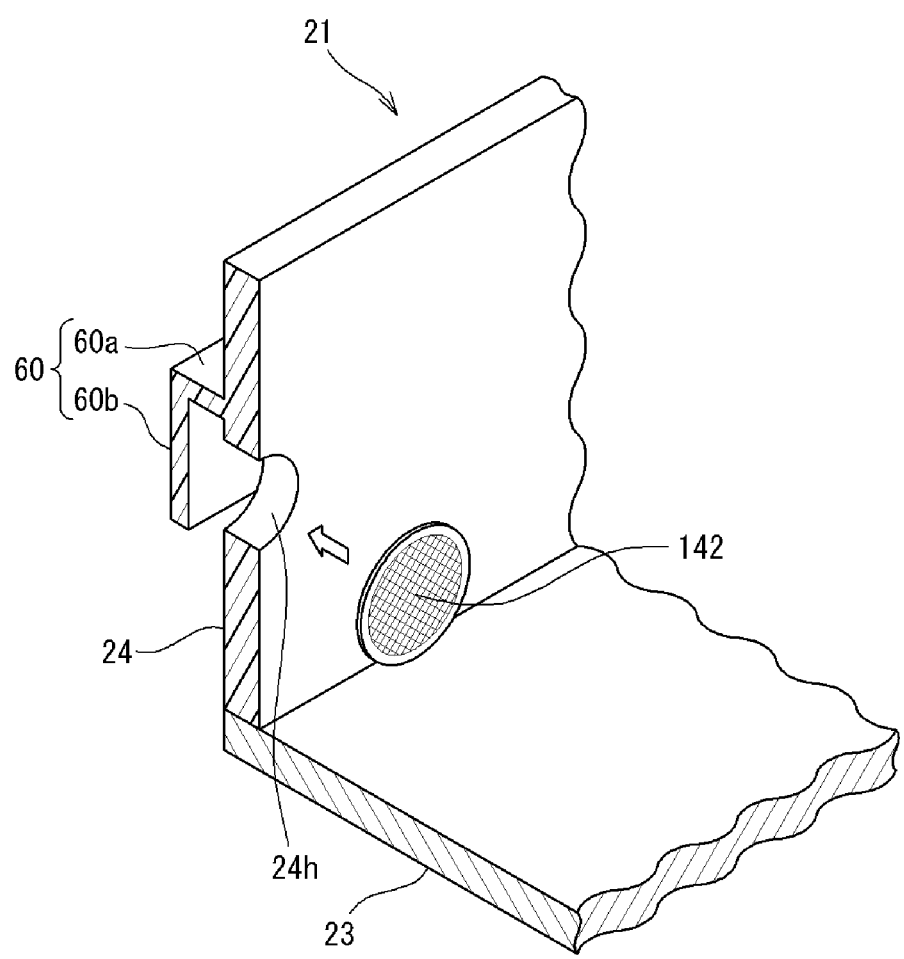
FIG. 12 is a perspective view showing further in detail a configuration around the vent hole.

FIG. 12 is a perspective view showing further in detail the configuration around the vent hole 24*h*. The configurations of the concentrating portion 22 and the power generating element 30 are the same as those in Part 1, and are not shown here.

That is, as in Part 1, the photovoltaic module 1 includes: the power generating elements 30 each configured to receive light to generate power; and the housing 21 which is closed and which houses the power generating elements 30. The housing 21 has: the concentrating portion 22 provided with the lenses (Fresnel lenses 220) configured to concentrate sunlight; the bottom portion 23 in which the power generating elements 30 are disposed; and the side walls 24 serving as the outer frame for the bottom portion 23 and supporting the concentrating portion 22.

On the outside of the side wall 24, an overhanging portion 60 made from a resin is formed integrally with the side wall 24. Forming the overhanging portion 60 integrally with the side wall 24 facilitates the manufacture thereof, but the overhanging portion 60 may not be integrally formed with the side wall 24. The overhanging portion 60 has the same shape and function as those of the exterior-side cover 141 described in Part 1, but including variations described later, such overhanging portions 60 will be hereafter collectively referred to as "overhanging portion".

That is, the overhanging portion 60 is in a shape that has: a projecting portion 60*a* projecting from above the vent hole 24*h* to outside relative to the side wall 24; and a hanging-down portion 60*b* hanging downwardly from the projecting leading end side along the outside of the vent hole 24*h*. Here, "above" means being at a higher level in the direction toward the concentrating portion 22 (not shown) viewed from the bottom portion 23, and "downwardly" or "downward" means toward a lower level in the direction opposite thereto. A filter 142 is welded to the outer edge portion on the inner face side of the vent hole 24*h*. This filter 142, different from the filter 142 explained with reference to FIG. 7, is a body separate from the side wall 24, and is mounted to the side wall 24 by welding, for example. The filter 142 is a mesh body made from a tetrafluoroethylene resin, for example.

Since such an overhanging portion 60 is provided, dust, water drops, foreign matter, and other things which come from above and the entry of which into the vent hole 24*h* is not desired (hereinafter, referred to as dust, etc.) can be excluded by the overhanging portion 60.

Figure 13:
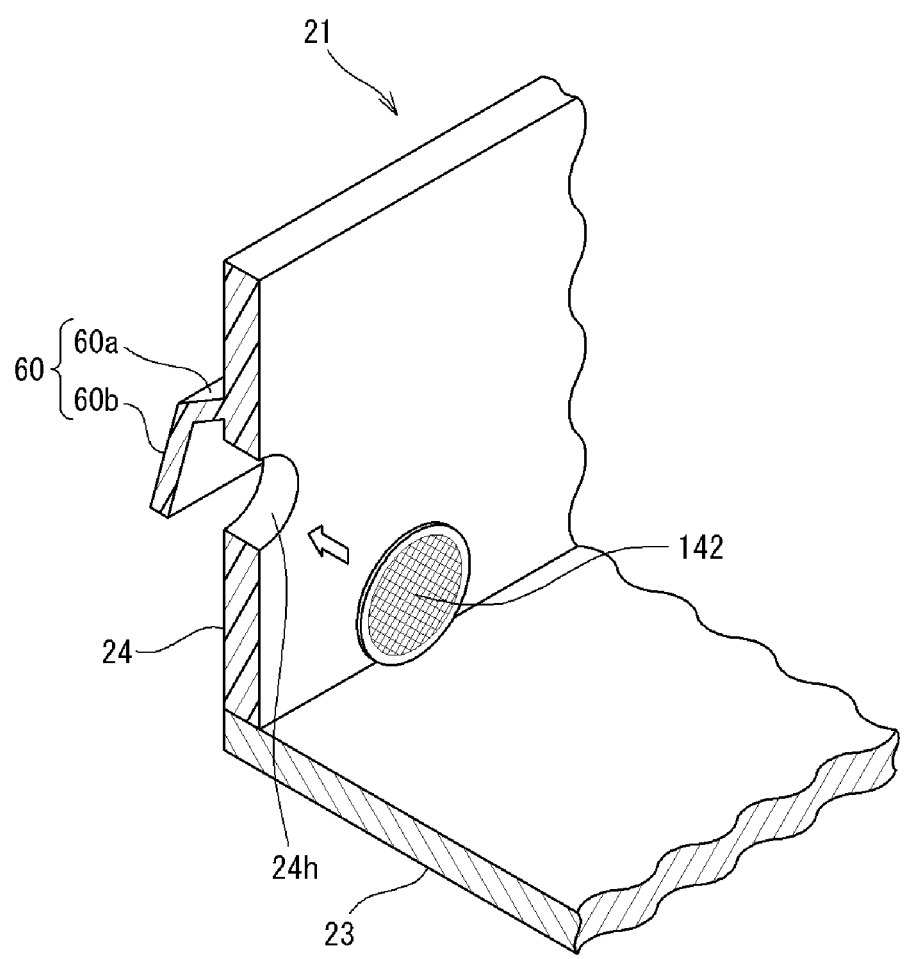
FIG. 13 is a perspective view showing a second example of a configuration of an overhanging portion.

Next, FIG. 13 is a perspective view showing a second example of the configuration of the overhanging portion 60. Except the shape of the overhanging portion 60, the overhanging portion 60 is the same as that shown in FIG. 12.

In FIG. 13, this overhanging portion 60 is in a shape that has: the projecting portion 60*a* projecting from above the vent hole 24*h* to outside relative to the side wall 24; and the hanging-down portion 60*b* hanging downwardly from the projecting leading end side along the outside of the vent hole 24*h*.

Here, the projecting portion 60*a* is formed so as to be downwardly inclined. The hanging-down portion 60*b* is slightly inclined so as to be increasingly away from the vent hole 24*h* along the downward direction. Therefore, the entirety of the upper face of the overhanging portion 60 is downwardly inclined. However, the hanging-down portion 60*b* may extend in a directly downward direction (vertically). In short, it is sufficient that the hanging-down portion 60*b*, as a whole, includes no portion that is flat (horizontal) or inclined upwardly.

Such a configuration of the overhanging portion 60 allows attached dust to easily slip off. Thus, this configuration is advantageous in that dust, etc. is less likely to deposit on the upper face of the overhanging portion.

Figure 14:
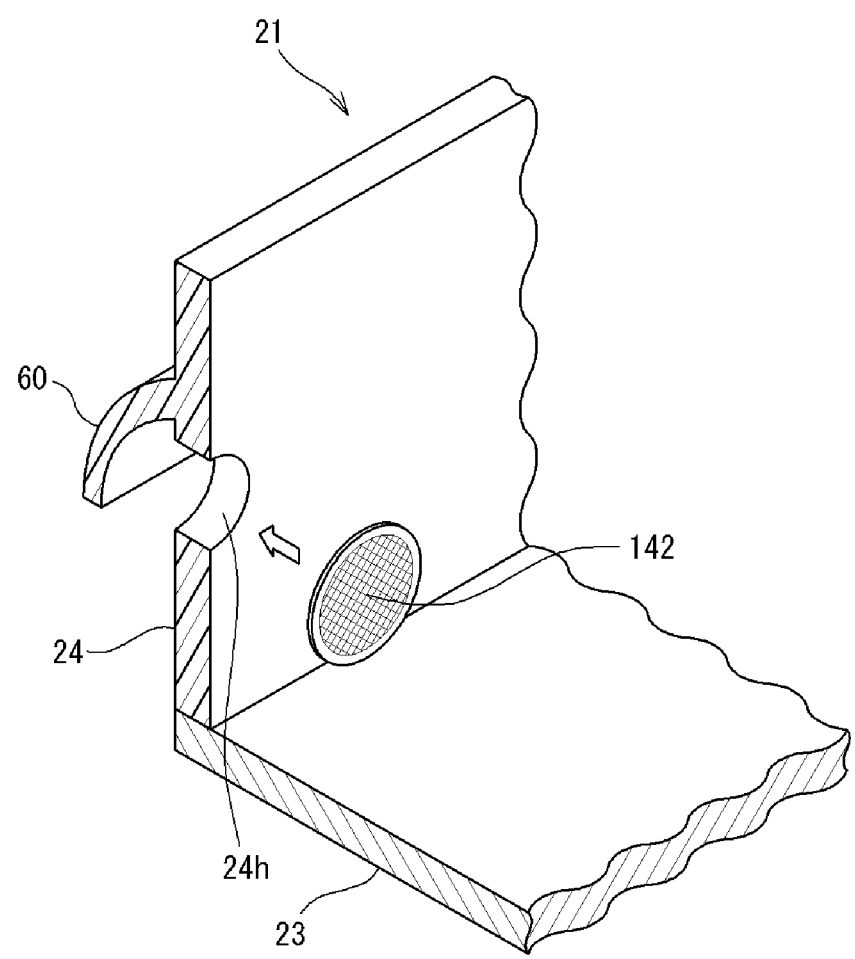
FIG. 14 is a perspective view showing a third example of a configuration of the overhanging portion.

Next, FIG. 14 is a perspective view showing a third example of the configuration of the overhanging portion 60. Except the shape of the overhanging portion 60, the overhanging portion 60 is the same as that shown in FIG. 12.

In FIG. 14, this overhanging portion 60 is in a smoothly-extending continuous shape that projects from above the vent hole 24*h* to outside relative to the side wall 24 and that hangs downwardly outside the vent hole 24*h*.

In this overhanging portion 60, the entirety of the upper face thereof is smoothly and downwardly inclined.

Such a configuration of the overhanging portion 60 allows attached dust to more easily slip off than the configuration shown in FIG. 13. Thus, this configuration is advantageous in that dust, etc. is less likely to deposit on the upper face of the overhanging portion.

Figure 15:
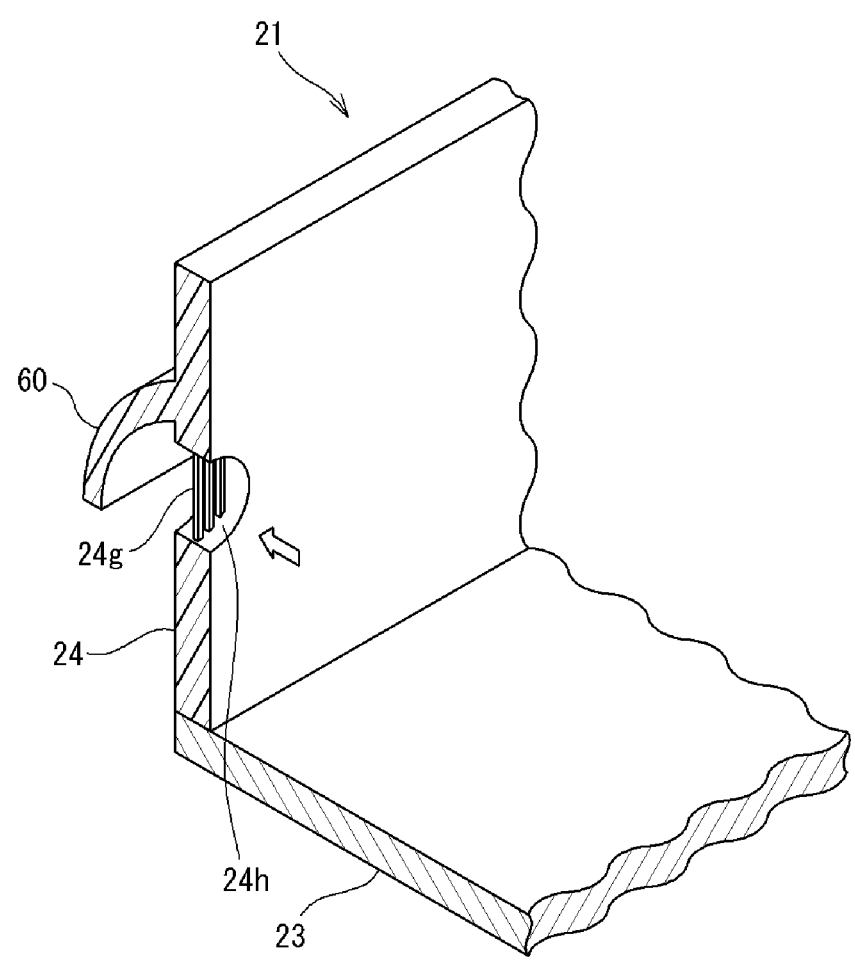
FIG. 15 is a perspective view showing a fourth example of a configuration around the overhanging portion.

Next, FIG. 15 is a perspective view showing a fourth example of the configuration around the overhanging portion 60. The shape of this overhanging portion 60 is the same as that shown in FIG. 14, and has the same effect as that obtained by the overhanging portion 60 shown in FIG. 14. The difference from FIG. 14 is that a grating portion 24g is formed at the vent hole 24h. By providing such a grating portion 24g, even if the filter 142 on the inner face side is omitted, it is possible to realize a certain effect of excluding dust, etc. In other words, this grating portion 24g is also a kind of "filter". That is, the grating portion 24g is a component similar to the filter 142 explained with reference to FIG. 7, and has a similar function as that of the filter 142 explained with reference to FIG. 7.

It should be noted that the grating portion 24g extends in the vertical direction, but may otherwise extend in the horizontal direction or in the form of a mesh. The opening dimensions and the opening ratio of the grating can be set as appropriate in consideration of the assumed size of dust, etc.

Figure 16:
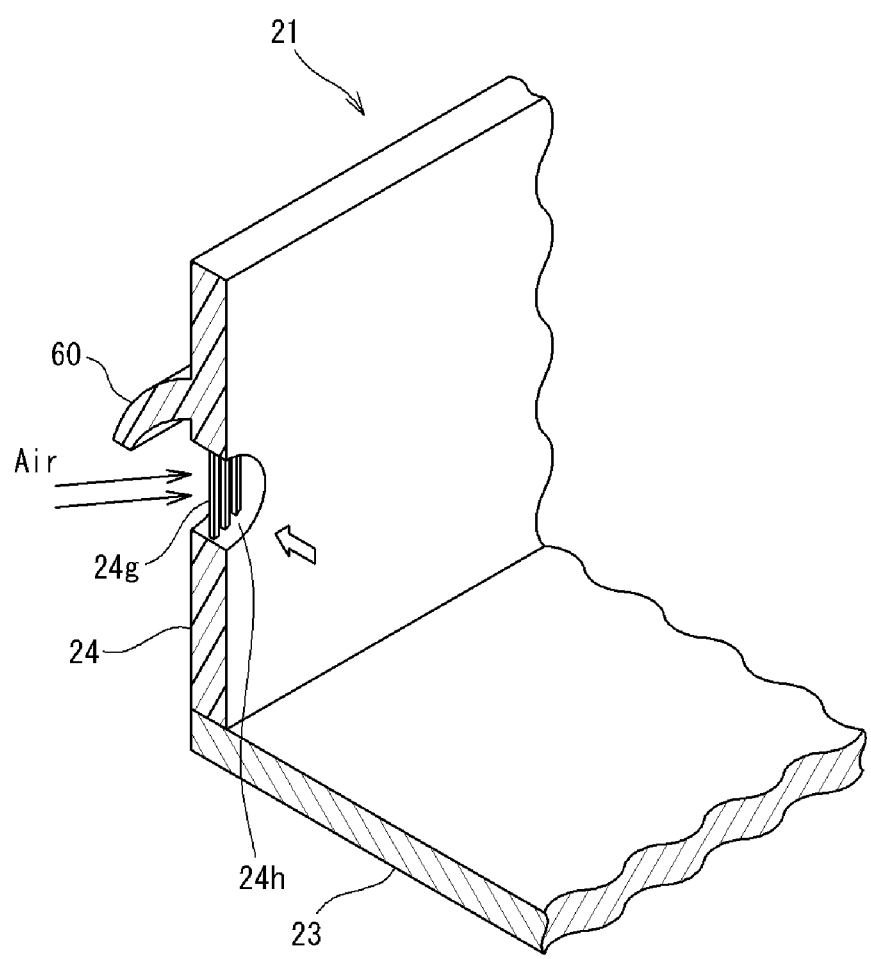
FIG. 16 is a perspective view showing a fifth example of a configuration of the overhanging portion.
Figure 17:
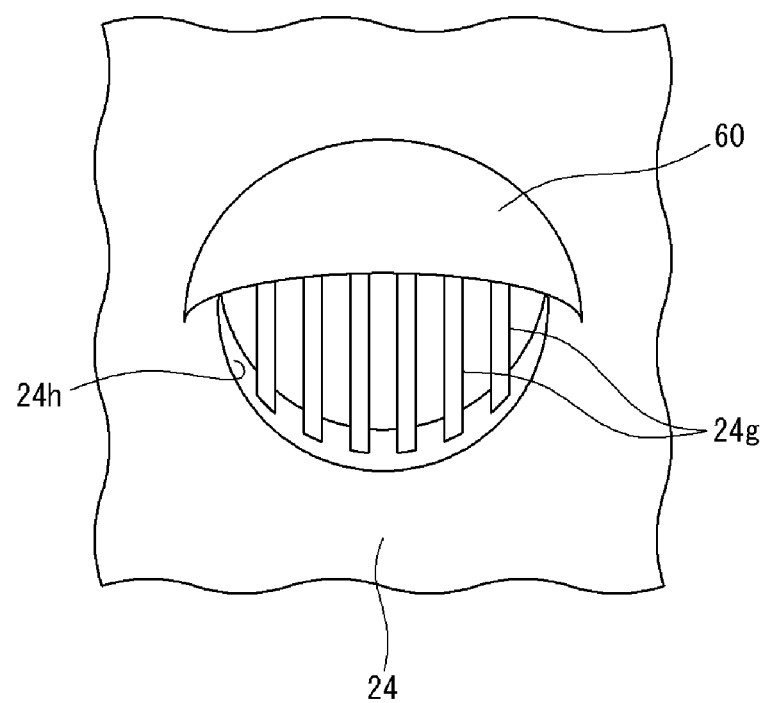
FIG. 17 is a front view of the overhanging portion shown in FIG. 16, viewed from outside.

Next, FIG. 16 is a perspective view showing a fifth example of the configuration of the overhanging portion 60. FIG. 17 is a front view of the overhanging portion 60 viewed from outside.

The grating portion 24g is provided at the vent hole 24h, as in the case of FIG. 15, and the grating portion 24g exhibits a similar effect. The difference from the fourth example shown in FIG. 15 is that, in the fifth example, the overhanging portion 60 is in a shape that hides a part of an upper portion of the vent hole 24h. In other words, the overhanging portion 60 does not hide the entirety of the vent hole 24h (i.e., there is some clearance in a lower portion thereof) from the outside front thereof. Therefore, it is possible to realize both exclusion of dust, etc. by means of the overhanging portion 60, and good ventilation through the vent hole 24h.

Figure 18:
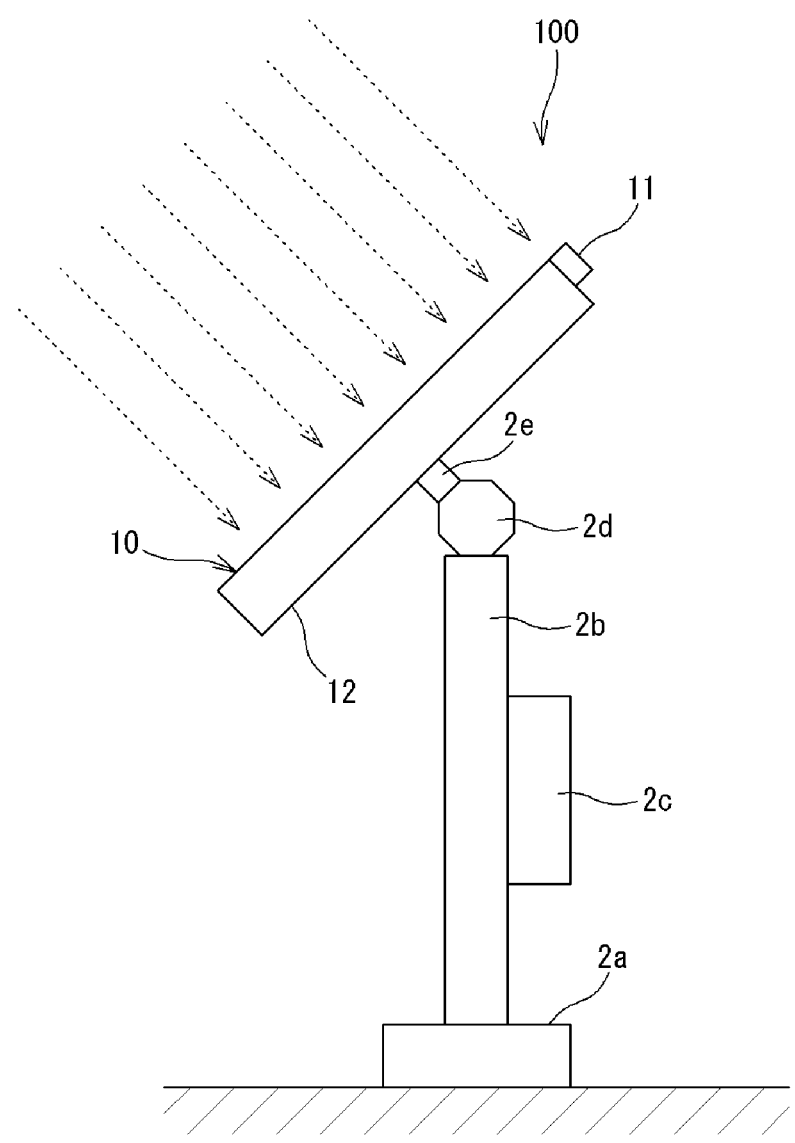
FIG. 18 is a side view showing the appearance of the photovoltaic apparatus.

Next, FIG. 18 is a side view showing the appearance of the photovoltaic apparatus 100. The pedestal 2 (FIG. 1) described in a simplified manner in Part 1 specifically includes: a base 2a shown in FIG. 18; a post 2b vertically provided above the base 2a; a control panel 2c mounted to the post 2b; a tracking mechanism 2d provided at the upper end of the post 2b; a tracking shaft 2e connecting the tracking mechanism 2d and a photovoltaic panel 10; and the panel housing 12.

The photovoltaic panel 10 is obtained by a plurality of the photovoltaic modules 1 being housed in the panel housing 12. A solar position sensor (tracking sensor) 11 for detecting the position of the sun is mounted to the photovoltaic panel 10.

The tracking mechanism 2d has a mechanism capable of being driven in two axes of azimuth and elevation, and is always controlled so as to perform tracking of the sun, by a controller (not shown) provided in the control panel 2c.

When tracking operation is being accurately performed, sunlight hits the photovoltaic panel 10 from the normal direction. That is, sunlight is incident on the photovoltaic panel 10 at an incident angle of 0 degree or within an allowable error range therefor (hereinafter, simply referred to as incident angle of 0 degree).

Figure 19:
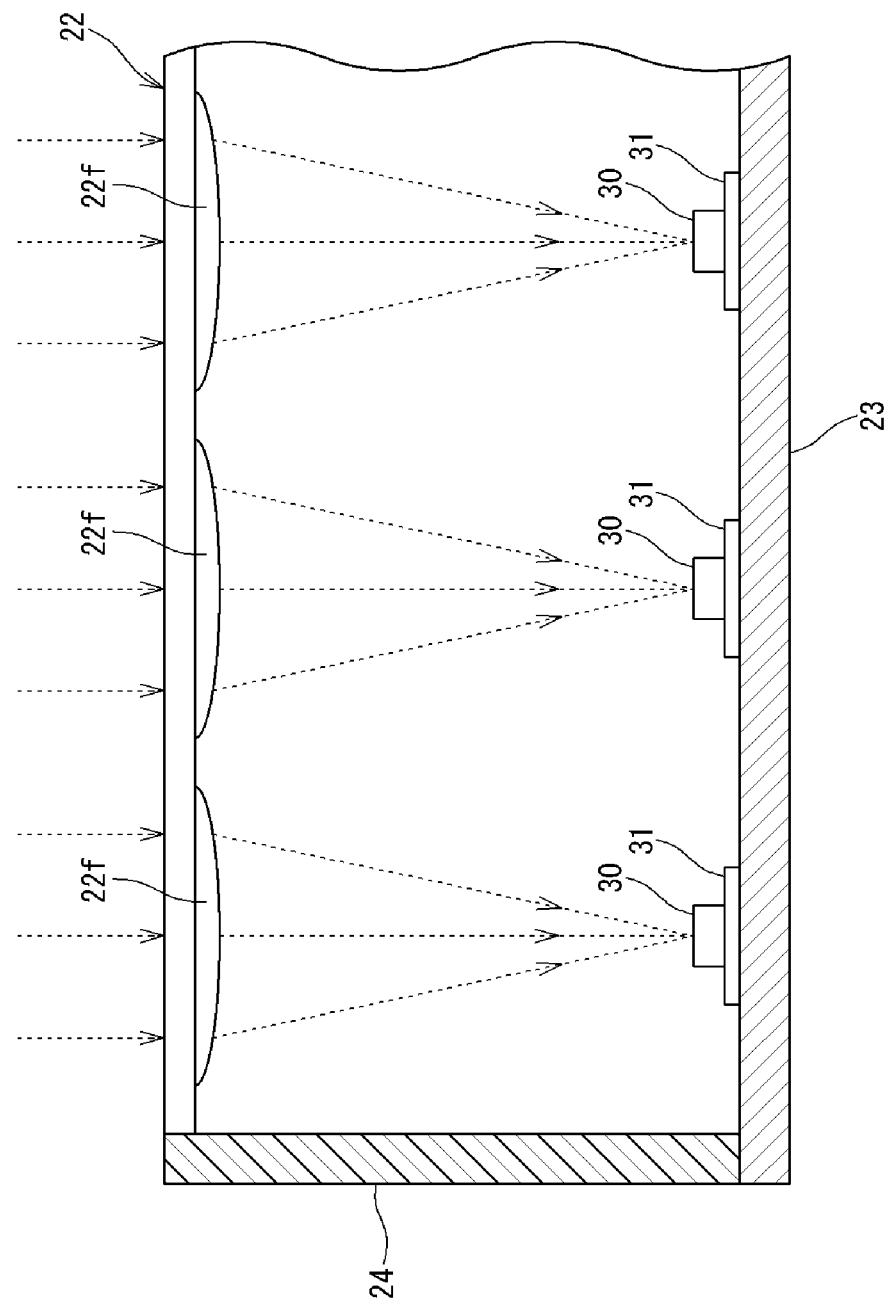
FIG. 19 is a cross-sectional view showing optical paths when sunlight is incident on each Fresnel lens of a concentrating portion, at an incident angle of 0 degree.

FIG. 19 is a cross-sectional view showing optical paths when sunlight is incident on each Fresnel lens 22f of the concentrating portion 22, at an incident angle of 0 degree. Each FPC 31 is provided to the bottom portion 23, and on top of the FPC 31, the power generating elements 30 are mounted. Sunlight concentrated by each Fresnel lens 22f is incident on its corresponding power generating element 30.

Figure 20:
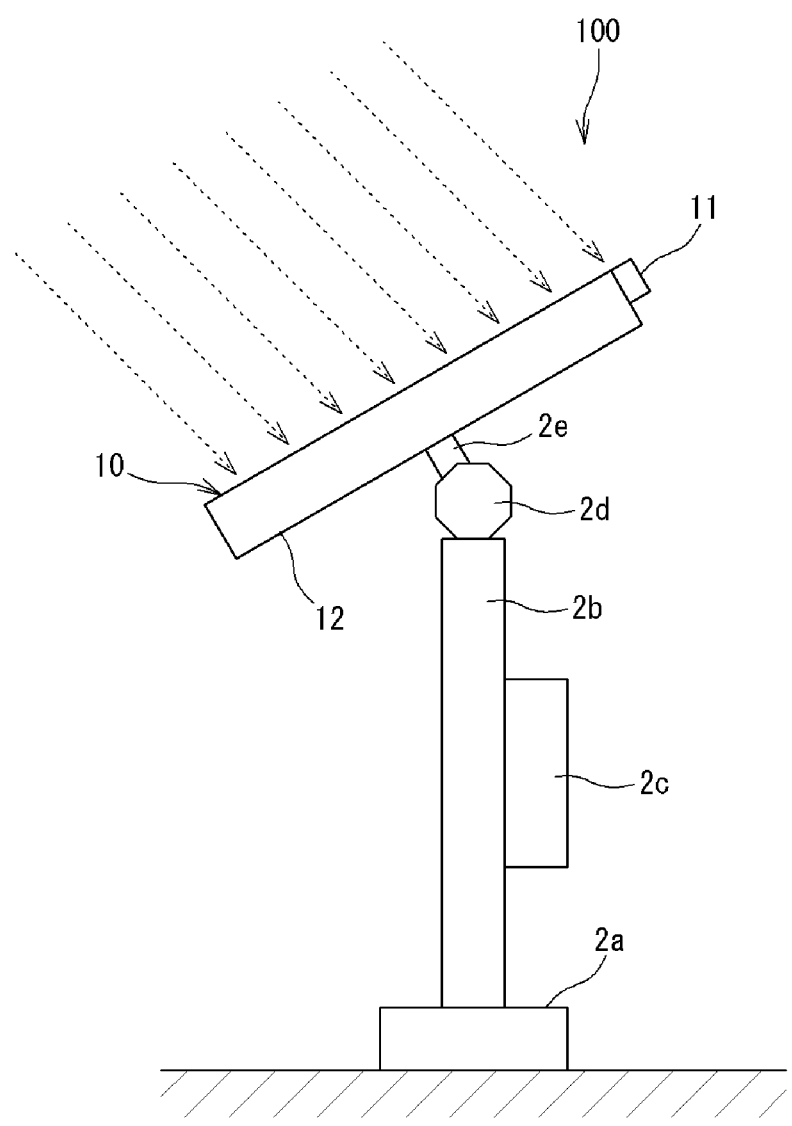
FIG. 20 is a side view showing the relationship between the photovoltaic apparatus and sunlight when there is tracking deviation.

Next, FIG. 20 is a side view showing the relationship between the photovoltaic apparatus 100 and sunlight when there is tracking deviation. In this case, sunlight is not incident on the photovoltaic panel 10 in the normal direction.

Figure 21:
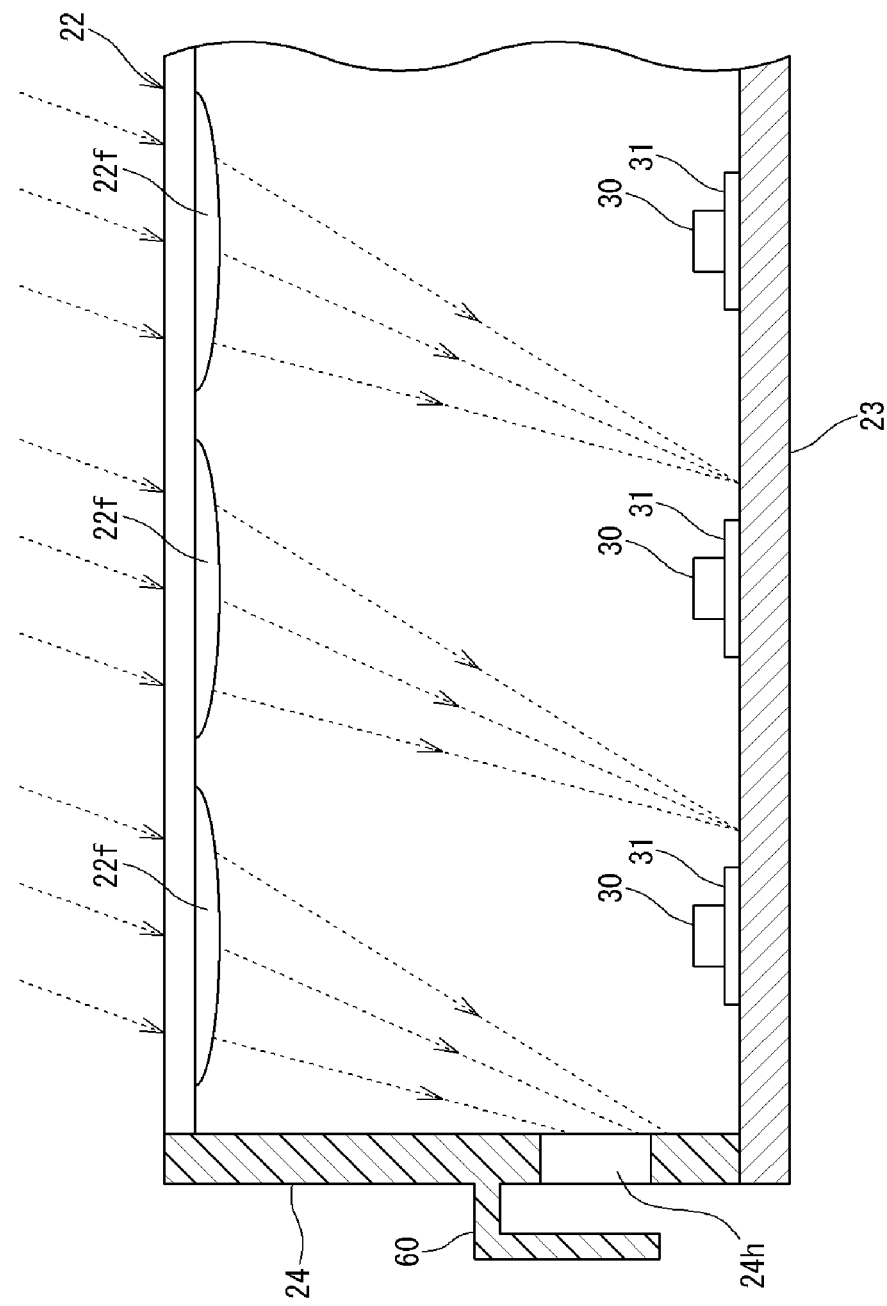
FIG. 21 is a cross-sectional view showing optical paths when sunlight is incident in a state where the incident angle relative to each Fresnel lens of the concentrating portion is greatly deviated from 0 degree to be outside an allowable range.

FIG. 21 is a cross-sectional view showing optical paths when sunlight is incident in a state where the incident angle relative to each Fresnel lens 22f of the concentrating portion 22 is greatly deviated from 0 degree to be outside the allowable range. In this case, there is a possibility that the light concentrated by the leftmost Fresnel lens 22f hits the vent hole 24h or the surrounding area thereof. In such a case, there is a possibility that there occurs burnout of the side wall 24 made from a resin, the filter 142, the inner wall of the vent hole 24h, or the grating portion 24g.

Figure 22:
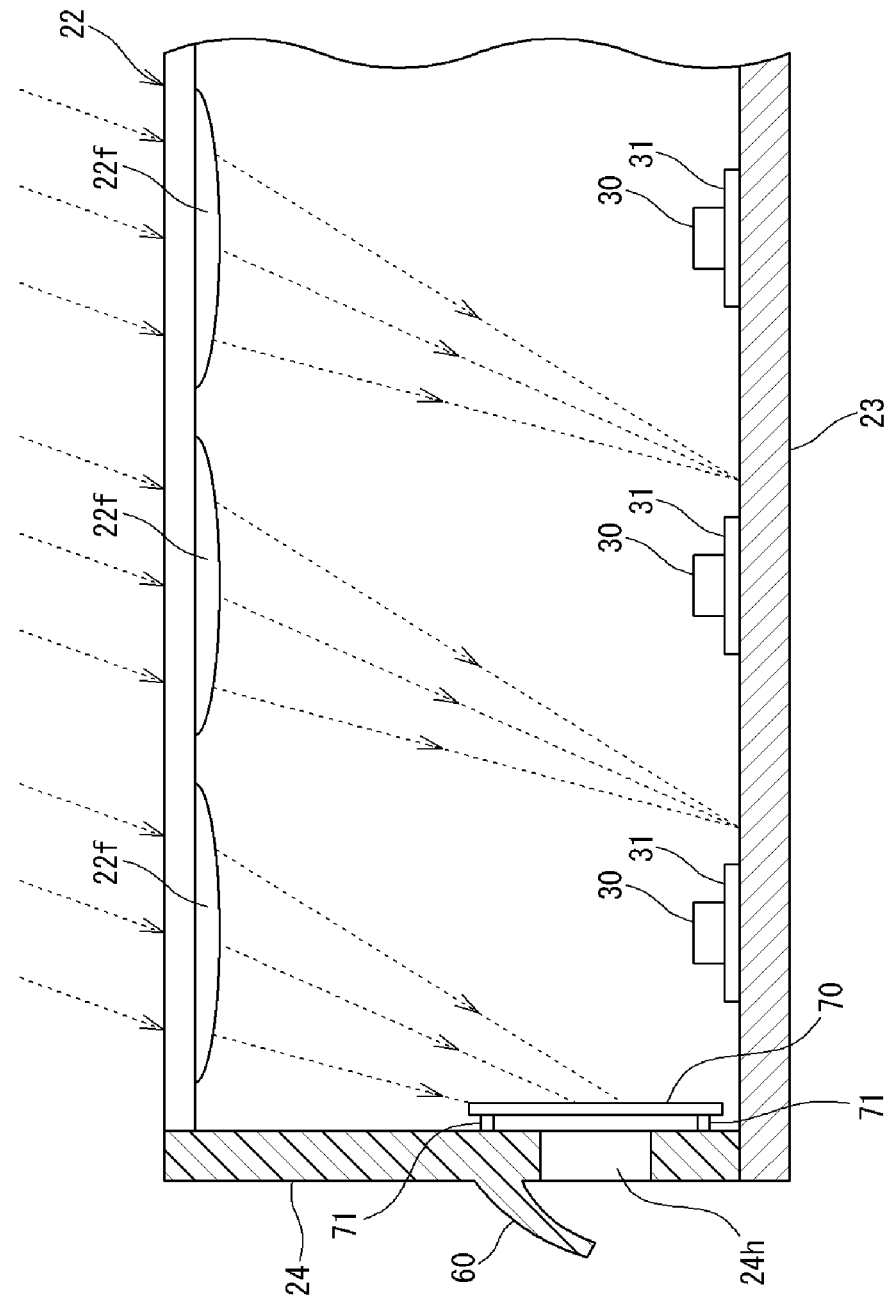
FIG. 22 is a cross-sectional view showing optical paths when sunlight is incident in a state where the incident angle relative to each Fresnel lens of the concentrating portion is greatly deviated from 0 degree to be outside the allowable range, as in the case of FIG. 21.

FIG. 22 is a cross-sectional view showing optical paths when sunlight is incident in a state where the incident angle relative to each Fresnel lens 22f of the concentrating portion 22 is greatly deviated from 0 degree to be outside the allowable range, as in the case of FIG. 21. However, in consideration of the possibilities mentioned above, a shielding plate 70 is provided. The shielding plate 70 is supported by a support arm portion 71 from the inner face of the side wall 24, and is provided so as to project inwardly. The shielding plate 70 is substantially parallel to the inner face of the side wall 24, and is disposed so as to hide the vent hole 24h from the inner face side of the side wall 24. However, since the support arm portion 71 is present, the shielding plate 70 does not close the vent hole 24h.

Figure 23:
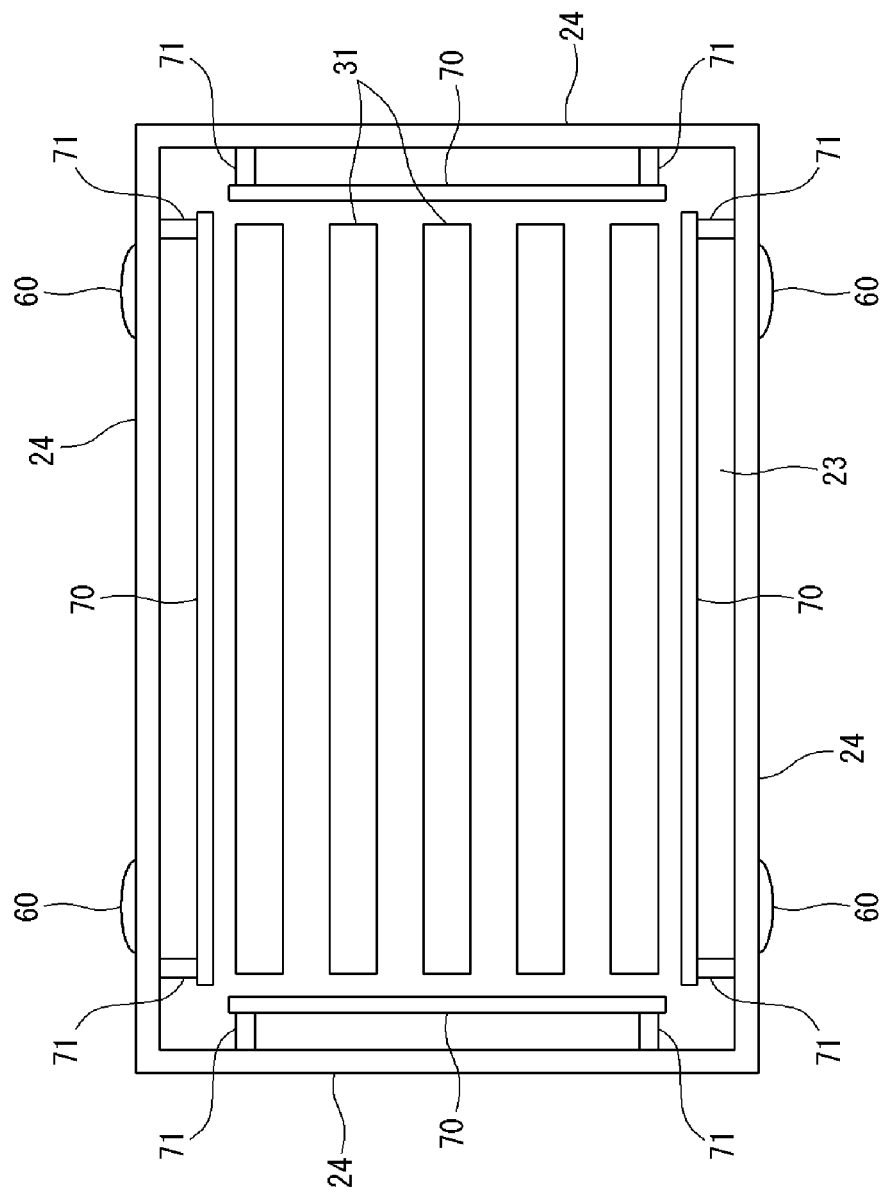
FIG. 23 is a schematic plan view showing arrangement of shielding plates in the housing with the concentrating portion omitted.

FIG. 23 is a schematic plan view showing arrangement of the shielding plates 70 in the housing 21 with the concentrating portion 22 omitted. As shown, the shielding plates 70 are provided along the inner faces of the four side walls 24, respectively. In this example, the vent holes 24h are provided in two pairs (i.e., four).

With reference back to FIG. 22, the shielding plate 70 provided so as to project inwardly along the inner face of the side wall 24 shields the vent hole 24h and the inner face of the side wall 24 from the concentrated sunlight when the concentrated sunlight is deviated from the corresponding power generating element 30. Through this shielding, it is possible to prevent burnout of the inner face of the side wall 24, the filter 142 provided at the vent hole 24h, and the grating portion 24g, for example. The shielding plate 70 can be formed from the same resin as that used for the side wall 24. Thus, the shielding plate 70 can also be formed integrally with the side wall 24.

Even when the same resin is used, burnout of the shielding plate 70 can be prevented. The reason for this is as follows. Since the shielding plate 70 is provided so as to project inwardly relative to the inner face of the side wall 24, the shielding plate 70 can receive the concentrated sunlight in the form of a relatively large spot of light not yet completely converged.

The shielding plate 70 is provided along each of the inner faces of the four side walls 24, and thus, in either case where the tracking deviation is in azimuth or in elevation, it is possible to prevent burnout of the inner face of the side wall 24, the filter 142 provided at the vent hole 24h, the grating portion 24g, and the like.

Supplementary Note

It should be noted that, in each of Part 1 and Part 2, the disclosed embodiments (examples) are to be considered in all aspects as illustrative and not restrictive. The scope of the present invention is defined by the claims, and is intended to include meaning equivalent to the scope of the claims and all modification within the scope.

REFERENCE SIGNS LIST 1, 1A, 1B photovoltaic module
2 pedestal
2a base
2b post
2c control panel
2d tracking mechanism
2e tracking shaft
10 photovoltaic panel
11 solar position sensor
12 panel housing
21 housing
22 concentrating portion
22f Fresnel lens (lens)
23 bottom portion
24 side wall
24g grating portion (filter)
24h vent hole
27 flange
28 mounting hole
29 bolt
30 power generating element
31 FPC
50 fitting portion
51, MA, 51B, 51C, MD flange
52A, 52B, 54C, 54D protruding portion
53A, 53B, 55C, 55D recessed portion
56 mounting hole (fixing portion)
57 bolt
60 overhanging portion
60a projecting portion
60b hanging-down portion
70 shielding plate
71 support arm portion
100 photovoltaic apparatus
140 foreign matter entry-suppressing portion
141 exterior-side cover (overhanging portion)
142 filter
C1 sun azimuth meter
E1 housing portion
F1 frame member
M1 drive portion

The invention claimed is:
1. A photovoltaic panel comprising:
a panel housing partitioned into a plurality of module-housing portions formed by a frame member with portions crossing each other in a vertical direction and a horizontal direction of the photovoltaic panel; and
a plurality of photovoltaic modules each having a concentrating portion and respectively mounted in the module-housing portions, wherein
each of the photovoltaic modules includes:
a plurality of power generating elements configured to receive light to generate power; and
a housing which is closed, the housing having: the concentrating portion provided with a plurality of Fresnel lenses arranged in a lattice pattern and configured to concentrate sunlight; a bottom portion in which the power generating elements are disposed; and a side wall serving as an outer frame for the bottom portion and supporting the concentrating portion, wherein a gap is formed between the side wall and the frame member of a position directly opposing and facing the side wall, and
the side wall is formed from a resin and has at least one vent hole at a position facing the frame member, the vent hole opening toward the gap to pass air through the gap and the vent hole with respect to each of the photovoltaic modules.

2. The photovoltaic panel according to claim 1, wherein when relative positional relationship between the concentrating portion and the bottom portion are correspondingly defined as upside and downside, an overhanging portion is formed in a shape projecting from above the vent hole toward outside relative to the side wall and hanging downwardly outside the vent hole.

3. The photovoltaic panel according to claim 2, wherein an upper face of the overhanging portion is downwardly inclined.

4. The photovoltaic panel according to claim 2, wherein the overhanging portion is in a shape that hides a part of an upper portion of the vent hole.

5. The photovoltaic panel according to claim 1, comprising
a foreign matter entry-suppressing portion configured to suppress entry of foreign matter into an interior space of the housing through the vent hole, wherein
the foreign matter entry-suppressing portion includes a filter for the vent hole.

6. The photovoltaic panel according to claim 5, wherein the housing is fixed to the frame member, and the side wall is facing the frame member in a state where the housing is fixed to the frame member, and
the foreign matter entry-suppressing portion includes the gap.

7. The photovoltaic panel according to claim 6, wherein the housing includes a flange configured to be in contact with the frame member in the state where the housing is fixed to the frame member, and
the gap is formed by the side wall, the flange, and the frame member.

8. A photovoltaic panel according to claim 1, wherein the housing includes a fitting portion to be coupled with the housing of an adjacent photovoltaic module.

9. The photovoltaic panel according to claim 8, wherein the housing includes, as the fitting portion, a flange extending along an extending direction of an upper face or a bottom face of the housing, and
the flange is capable of being fitted to a flange of the housing of the adjacent photovoltaic module.

10. The photovoltaic panel according to claim 9, wherein the flange of the housing is provided with a fixing portion for fixing the housing to the frame member to which a plurality of the photovoltaic modules are mounted side by side, and
in a state where a plurality of the housings are fixed to the frame member, a plurality of the fixing portions respectively provided to the plurality of the flanges are arranged in one line along an extending direction of the frame member.

11. The photovoltaic panel according to claim 8, wherein the fitting portion is provided to a face that includes either one of an upper face and a bottom face of the housing.

12. The photovoltaic panel according to claim 1, wherein a shielding plate is provided so as to inwardly project along an inner face of the side wall, the shielding plate being configured to shield the inner face and the vent hole from concentrated sunlight when the concentrated sunlight is deviated from one of the power generating elements.

\* \* \* \* \*